US009214639B2

(12) United States Patent
Gleason et al.

(10) Patent No.: US 9,214,639 B2
(45) Date of Patent: Dec. 15, 2015

(54) CONDUCTIVE POLYMER ON A TEXTURED OR PLASTIC SUBSTRATE

(75) Inventors: Karen K. Gleason, Cambridge, MA (US); Vladimir Bulovic, Lexington, MA (US); Miles C. Barr, Cambridge, MA (US); Jill A. Rowehl, Watertown, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 449 days.

(21) Appl. No.: 12/822,691

(22) Filed: Jun. 24, 2010

(65) Prior Publication Data

US 2011/0315204 A1  Dec. 29, 2011

(51) Int. Cl.
| | |
|---|---|
| H01L 31/00 | (2006.01) |
| H01L 51/00 | (2006.01) |
| B82Y 10/00 | (2011.01) |
| C09D 5/24 | (2006.01) |
| H01B 1/12 | (2006.01) |
| H05B 33/26 | (2006.01) |
| H01L 51/42 | (2006.01) |
| H01L 51/52 | (2006.01) |

(52) U.S. Cl.
CPC .............. *H01L 51/0097* (2013.01); *B82Y 10/00* (2013.01); *C09D 5/24* (2013.01); *H01B 1/127* (2013.01); *H05B 33/26* (2013.01); *H01L 51/0046* (2013.01); *H01L 51/4253* (2013.01); *H01L 51/5206* (2013.01); *H01L 2251/5338* (2013.01); *Y02E 10/549* (2013.01)

(58) Field of Classification Search
CPC ..................... Y02E 10/549; H01L 2251/5338; H01L 51/422
USPC .................................................. 136/243–265
See application file for complete search history.

(56) References Cited

U.S. PATENT DOCUMENTS

| | | | |
|---|---|---|---|
| 5,792,558 A | 8/1998 | Jonas et al. | |
| 7,332,211 B1 | 2/2008 | Bulovic et al. | |
| 7,618,680 B2 | 11/2009 | Gleason et al. | |
| 2003/0230337 A1* | 12/2003 | Gaudiana et al. ............. | 136/256 |
| 2004/0023010 A1 | 2/2004 | Bulovic et al. | |
| 2004/0253427 A1* | 12/2004 | Yokogawa et al. ........... | 428/212 |
| 2007/0207565 A1* | 9/2007 | Kodas et al. .................... | 438/61 |
| 2008/0041438 A1* | 2/2008 | Saito et al. ..................... | 136/244 |

FOREIGN PATENT DOCUMENTS

| | | |
|---|---|---|
| EP | 0339340 | 4/1988 |
| EP | 0440957 | 12/1990 |
| EP | 0564911 | 3/1993 |
| EP | 0686662 | 4/1995 |
| WO | WO 2006/130656 | 12/2006 |

OTHER PUBLICATIONS

Sung Gap Im, (Oxidative and Initiated Chemical Vapor Deposition for Application to Organic Electronics), Feb. 17, 2009.*

(Continued)

*Primary Examiner* — Allison Bourke
*Assistant Examiner* — Niki Bakhtiari
(74) *Attorney, Agent, or Firm* — Steptoe & Johnson LLP

(57) ABSTRACT

A conducting material can include a fibrous substrate and a conductive polymer coating on a surface of the fibrous substrate.

20 Claims, 9 Drawing Sheets

(56) References Cited

OTHER PUBLICATIONS

Admassie et al, "A polymer photodiode using vapour-phase polymerized PEDOT as an anode," Solar Energy Materials and Solar Cells, Elsevier Science Publishers, Amsterdam, vol. 90, No. 2, Jan. 23, 2006, pp. 133-141.
Lock, John P. et al., "Oxidative Chemical Vapor Deposition of Electrically Conducting Poly(3,4-ethylenedioxythiphene) Films," Macromolecules, vol. 39, No. 16, Aug. 1, 2006; pp. 5326-5329.
Alf, Mahriah E. et al., "Chemical Vapor Deposition of Conformal, Functional, and Responsive Polymer Films," Advanced Materials, vol. 22, No. 18, May 11, 2010, pp. 1993-2027.
Lidzey et al, "Laser-assisted patterning of conjugated polymer light emitting diodes," Organic Electronics, Elsevier, Amsterdam, No. 6, No. 5-6, Dec. 1, 2005, pp. 221-228.
Holdcroft, S., "Patterning PI-Conjugated Polymers," Advanced Materials, Wiley VCH Verlag, DE, vol. 13, No. 23, Dec. 3, 2001, pp. 1753-1765.
Jorgensen, M. et al., "Stability/degradation of polymer solar cells," Solar Energy Materials and Solar Cells, Elsevier Science Publishers, Amsterdam, vol. 92, No. 7, Jul. 1, 2008, pp. 686-714.
International Search Report and Written Opinion of the International Searching Authority dated Jan. 4, 2012 for PCT/US2011/041758.
Aleshin, et al., "Metallic conductivity at low temperatures in poly(3,4-ethylenedioxythiophene) doped with PF6," Physical Review B 56(7), 3659-3663 (1997).
Alf, et al., "Chemical Vapor Deposition of Conformal, Functional, and Responsive Polymer Films" Adv. Mater. 22, 1993 (2010).
Angelopoulos, et al., "Polyaniline—Solutions, Films and Oxidation-State," Molecular Crystals and Liquid Crystals 160, 151-163 (1988).
Argun, et al., "Multicolored electrochromism polymers: Structures and devices," Chemistry of Materials 16(23), 4401-4412 (2004).
Armstrong, et al., "Interface modification of ITO thin films: organic photovoltaic cells" Thin Solid Films 445, 342 (2003).
Baxamusa, et al., "Initiated and oxidative chemical vapor deposition: a scalable method for conformal and functional polymer films on real substrates." Phys Chem Chem Phys 11, 5227 (2009).
Borredon, et al., Journal of Polymer Science Part C-Polymer Symposia 16, 2931-2942 (1967).
Brown, et al., "Built-in field electroabsorption spectroscopy of polymer light-emitting diodes incorporating a doped poly(3,4-ethylene dioxythiophene) hole injection layer," Applied Physics Letters 75(12), 1679-1681 (1999).
Brumbach, et al., "Titanyl phthalocyanine/C-60 heterojunctions: Band-edge offsets and photovoltaic device performance" J. Phys. Chem. C 112, 3142 (2008).
Bruschi, et al., "Low-Frequency Resistance Fluctuation Measurements on Conducting Polymer Thin-Film Resistors," Journal of Applied Physics 76(6), 3640-3644 (1994).
Burkey, et al., "Structure and mechanical properties of thin films deposited from 1,3,5- trimethy1-1,3,5-trivinylcyclotrisiloxane and water" J Appl Phys 93, 5143 (2003).
Cacialli, et al., "Site-selective chemical-vapor-deposition of submicron-wide conducting polypyrrole films: Morphological investigations with the scanning electron and the atomic force microscope," Journal of Applied Physics 80(1), 70-75 (1996).
Cairns, et al., "Strain-dependent electrical resistance of tin-doped indium oxide on polymer substrates" Appl. Phys. Lett. 76, 1425 (2000).
Cao, et al., "Influence of Chemical Polymerization Conditions on the Properties of Polyaniline," Polymer 30(12), 2305-2311 (1989).
Chabinyc, et al., "Materials requirements and fabrication of active matrix arrays of organic thin-film transistors for displays," Chemistry of Materials 16(23), 4509-4521 (2004).
Chen, "Evolution of red organic light-emitting diodes: Materials and devices," Chemistry of Materials 16(23), 4389-4400 (2004).
Chiang, et al., "Polyaniline—Protonic Acid Doping of the Emeraldine Form to the Metallic Regime," Synthetic Metals 13(1-3), 193-205 (1986).

Coakley, et al., "Conjugated polymer photovoltaic cells," Chemistry of Materials 16(23), 4533-4542 (2004).
Corradi, et al., "Chemical synthesis of poly(3,4-ethylenedioxythiophene)," Synthetic Metals 84(1-3), 453-454 (1997).
Deberry, "Modification of the Electrochemical and Corrosion Behavior of Stainless-Steels with an Electroactive Coating," Journal of the Electrochemical Society 132(5), 1022-1026 (1985).
Dietrich, et al., "Electrochemical and Spectroscopic Characterization of Polyalkylenedioxythiophenes," Journal of Electroanalytical Chemistry 369(1-2), 87-92 (1994).
Dillingham, et al., "Investigation of Vapor-Deposited Polyaniline Thin-Films," Journal of Vacuum Science & Technology a-Vacuum Surfaces and Films 12(4), 2436-2440 (1994).
Genies, et al., "Polyaniline—a Historical Survey," Synthetic Metals 36(2), 139-182 (1990).
Greczynski, et al., "Photoelectron spectroscopy of thin films of PEDOT-PSS conjugated polymer blend: a mini-review and some new results," Journal of Electron Spectroscopy and Related Phenomena 121(1-3), 1-17 (2001).
Groenendaal, et al., "Poly(3,4-ethylenedioxythiophene) and its derivatives: Past, present, and future," Advanced Materials 12(7), 481-494 (2000).
Groenewoud, et al., "Effect of dopants on the transparency and stability of the conductivity of plasma polymerised thiophene layers," Synthetic Metals 126(2-3), 143-149 (2002).
Groenewoud, et al., "On the iodine doping process of plasma polymerised thiophene layers," Synthetic Metals 125(3), 429-440 (2001).
Gu, et al., "Solvent-less polymerization to grow thin films on solid substrates," Advanced Functional Materials 14(5), 492-500 (2004).
Gu, et al., "Using soft lithography to pattern highly oriented polyacetylene (HOPA) films via solvent-less polymerization," Advanced Materials 16(15), 1356 (2004).
Ha, et al., "Towards a transparent, highly conductive poly(3,4-ethylenedioxythiophene)." Adv. Funct. Mater. 14, 615 (2004).
Hansen, et al., "Highly stretchable and conductive polymer material made from poly (3,4-ethylenedioxythiophene) and polyurethane elastomers" Adv. Funct. Mater. 17, 3069 (2007).
Heywang, et al., "Poly(Alkylenedioxythiophene)S—New, Very Stable Conducting Polymers," Advanced Materials 4(2), 116-118 (1992).
Hohnholz, et al., "Uniform thin films of poly-3,4-ethylenedioxythiophene (PEDOT) prepared by in-situ deposition," Chemical Communications (23), 2444-2445 (2001).
Im, et al., "Doping level and work function control in oxidative chemical vapor deposited poly (3,4-ethylenedioxythiophene)." Appl. Phys. Lett. 90 (2007).
Im, et al., "Grafted conducting polymer films for nano-patterning onto various organic and inorganic substrates by oxidative chemical vapor deposition." Adv. Mater. 19, 2863 (2007).
Im, et al., "Systematic control of the electrical conductivity of poly(3,4-ethylenedioxythiophene) via oxidative chemical vapor deposition." Macromolecules 40, 6552 (2007).
James, et al., "Electrical measurements in molecular electronics," Chemistry of Materials 16(23), 4423-4435 (2004).
Jonas, et al., "Poly(3,4-Ethylenedioxythiophene)—Conductive Coatings, Technical Applications and Properties," Macromolecular Symposia 100, 169-173 (1995).
Jonas, et al., "Technical Applications for Conductive Polymers," Electrochimica Acta 39(8-9), 1345-1347 (1994).
Jonas, et al., "3,4-polyethylenedioxythiophene (PEDT): Conductive coatings technical applications and properties," Synthetic Metals 85(1-3), 1397-1398 (1997).
Jonas, et al., "Conductive Modifications of Polymers with Polypyrroles and Polythiophenes," Synthetic Metals 41(3), 831-836 (1991).
Kiebooms, et al., "Thermal and electromagnetic behavior of doped poly(3,4-ethylenedioxythiophene) films," Journal of Physical Chemistry B 101(51), 11037-11039 (1997).
Kim et al., "Enhancement of electrical conductivity of poly(3,4-ethylenedioxythiophene)/poly(4-styrenesulfonate) by a change of solvents," Synthetic Metals 126(2-3), 311-316 (2002).

(56) References Cited

OTHER PUBLICATIONS

Kim, et al., "The preparation and characteristics of conductive poly(3,4-ethylenedioxythiophene) thin film by vapor-phase polymerization," Synthetic Metals 139(2), 485-489 (2003).
Kim, et al., "Large-scale pattern growth of graphene films for stretchable transparent electrodes" Nature 457, 706 (2009).
Kogan, et al., "An oxidizing agent for aniline polymerization," Synthetic Metals 100(3), 303-303 (1999).
Kulkarni, et al., "Electron transport materials for organic light-emitting diodes," Chemistry of Materials 16(23), 4556-4573 (2004).
Li, et al., "Stretchability of thin metal films on elastomer substrates" Appl. Phys. Lett. 85, 3435 (2004).
Louwet, et al., "PEDOT/PSS: synthesis, characterization, properties and applications," Synthetic Metals 135(1-3), 115-117 (2003).
Malinauskas, "Chemical deposition of conducting polymers," Polymer 42(9), 3957-3972 (2001).
Mathai, et al., "Characterization of low dielectric constant polyaniline thin film synthesized by ac plasma polymerization technique," Journal of Physics D-Applied Physics 35(3), 240-245 (2002).
Meng, et al., "Solid-state synthesis of a conducting polythiophene via an unprecedented heterocyclic coupling reaction," Journal of the American Chemical Society 125(49), 15151-15162 (2003).
Mengoli, et al., "Anodic Synthesis of Sulfur-Bridged Polyaniline Coatings onto Fe Sheets," Journal of Applied Polymer Science 28(3), 1125-1136 (1983).
Mohammadi, et al., "Synthesis of Conducting Polypyrrole on a Polymeric Template," Synthetic Metals 41(1-2), 381-384 (1991).
Murashima, et al., "Electrical-Conductivity of Plasma-Polymerized Organic Thin-Films—Influence of Plasma Polymerization Conditions and Surface-Composition," Synthetic Metals 33(3), 373-380 (1989).
Na, et al., "Efficient and Flexible ITO-Free Organic Solar Cells Using Highly Conductive Polymer Anodes", Adv. Mater. 20, 4061 (2008).
Nakata, et al., "Synthesis of Electrical Conductive Polypyrrole Films by Interphase Oxidative Polymerization—Effects of Polymerization Temperature and Oxidizing-Agents," Polymer Journal 24(5), 437-441 (1992).
Nannini, et al., "Growth of Polypyrrole in a Pattern—a Technological Approach to Conducting Polymers," Journal of Molecular Electronics 6(2), 81-88 (1990).
Newman, et al., "Introduction to organic thin film transistors and design of n-channel organic semiconductors," Chemistry of Materials 16(23), 4436-4451 (2004).
Ogasawara, et al., "Enhancement of Electrical-Conductivity of Polypyrrole by Stretching" Synth. Met. 14, 61 (1986).
Otero, et al., Electrochimica Acta 39, 245 (1994).
Pei, et al., "Electrochromic and Highly Stable Poly(3,4-Ethylenedioxythiophene) Switches between Opaque Blue-Black and Transparent Sky Blue," Polymer 35(7), 1347-1351 (1994).
Peumans, et al. "Very-high-efficiency double-heterostructure copper phthalocyanine/C-60 photovoltaic cells" Appl. Phys. Lett. 79, 126 (2001).
Porter, et al., "Structure of Chemically Prepared Freestanding and Vacuum-Evaporated Polyaniline Thin-Films," Journal of Vacuum Science & Technology a-Vacuum Surfaces and Films 12(4), 2441-2445 (1994).
Pron, et al., "The Effect of the Oxidation Conditions on the Chemical Polymerization of Polyaniline," Synthetic Metals 24(3), 193-201 (1988).
Pryce-Lewis, et al. "Pulsed-PECVD Films from Hexamethylcyclotrisiloxane for Use as Insulating Biomaterials" Chem Mater 12, 3488 (2000).
Rogers, et al., "Materials and Mechanics for Stretchable Electronics" Science 327, 1603.
Sadki, et al., Chemical Society Reviews 29, 283 (2000).
Schultes, et al., "The role of molecular architecture and layer composition on the properties and performance of CuPc-C-60 photovoltaic devices" Mater. Sci. Eng., C 25, 858 (2005).
Sekitani, et al., "A rubberlike stretchable active matrix using elastic conductors" Science 321, 1468 (2008).
Serra, et al., "Study of the influence of oxidising salt on conducting polymer sensor properties," Materials Science & Engineering C-Biomimetic Materials Sensors and Systems 5(3-4), 259-263 (1998).
Shenoy, et al., "A solvent-free process for preparing conductive elastomers by an in situ polymerization of pyrrole," Industrial & Engineering Chemistry Research 41(6), 1484-1488 (2002).
Shirakawa, et al., "Synthesis of Electrically Conducting Organic Polymers—Halogen Derivatives of Polyacetylene, (Ch)X," Journal of the Chemical Society-Chemical Communications 16, 578-580 (1977).
Siegel, et al., "Foldable Printed Circuit Boards on Paper Substrates" Adv. Funct. Mater. 20, 28 (2010).
Smela, "Microfabrication of PPy microactuators and other conjugated polymer devices," Journal of Micromechanics and Microengineering 9(1), 1-18 (1999).
Snaith, et al., "Morphological and electronic consequences of modifications to the polymer anode 'PEDOT : PSS'" Polymer 46, 2573 (2005).
Sorita, et al., "Formation of Polymerized Thiophene Films by Photochemical Vapor-Deposition," Thin Solid Films 177, 295-303 (1989).
Tamada, et al., "Preparation of polyvinylcarbazole thin film with vapor deposition polymerization," Thin Solid Films 268(1-2), 18-21 (1995).
Tan, et al., "Investigation into vapour-phase formation of polypyrrole," Polymer 37(6), 965-968 (1996).
Tanaka, et al., "Plasma Polymerization of Thiophene and 3-Methylthiophene," Synthetic Metals 38(1), 107-116 (1990).
Tran-Van, et al., "Fully undoped and soluble oligo(3,4-ethylenedioxythiophene)s: spectroscopic study and electrochemical characterization," Journal of Materials Chemistry 11(5), 1378-1382 (2001).
Trnka, et al., "The development of L2X2Ru=CHR olefin metathesis catalysts: An organometallic success story," Accounts of Chemical Research 34(1), 18-29 (2001).
Urdaneta, et al., "Stretchable electrodes with high conductivity and photo-patternability" Adv. Mater. 19, 2629 (2007).
Vaeth, et al., "Chemical vapor deposition of thin polymer films used is polymer-based light emitting diodes," Advanced Materials 9(6), 490—& (1997).
Vaeth, et al., "Transition metals for selective chemical vapor deposition of parylene-based polymers," Chemistry of Materials 12(5), 1305-1313 (2000).
Walker, et al., "New Chemically Prepared Conducting Pyrrole Blacks," Journal of Polymer Science Part a-Polymer Chemistry 26(5), 1285-1294 (1988).
Wang, et al., "Preparation, properties and applications of polypyrroles," Reactive & Functional Polymers 47(2), 125-139 (2001).
White, et al., "Electrochemically and vapour grown electrode coatings of poly(3,4-ethylenedioxythiophene) doped with heteropolyacids," Electrochimica Acta 49(6), 861-865 (2004).
Winther-Jensen, et al., "Vapor phase polymerization of pyrrole and thiophene using iron(III) sulfonates as oxidizing agents," Macromolecules 37(16), 5930-5935 (2004).
Winther-Jensen, et al., "Vapor-phase polymerization of 3,4-ethylenedioxythiophene: A route to highly conducting polymer surface layers," Macromolecules 37(12), 4538-4543 (2004).
Xu, et al., "Continuous Vapor-Phase Polymerization of Pyrrole Electrically Conductive Composite Fiber of Polypyrrole with Poly(P-Phenylene Terephthalamide)," Journal of Applied Polymer Science 58(12), 2155-2159 (1995).
Yamamoto, et al., "Synthesis of non-doped poly(3,4-ethylenedioxythiophene) and its spectroscopic data," Synthetic Metals 100(2), 237-239 (1999).
Yamato, et al., "Synthesis of free-standing poly(3,4-ethylenedioxythiophene) conducting polymer films on a pilot scale," Synthetic Metals 83(2), 125-130 (1996).
Yang, et al., "Controlled growth of a molecular bulk heterojunction photovoltaic cell" Nature Mater. 4, 37 (2005).
Yasuda, et al., "Chemical Oxidative Polymerization of Aniline with Ferric-Chloride," Polymer Journal 25(4), 329-338 (1993).
Yu, et al., Applied Physics Letters 73:111-113 (1998).
Zaharias, et al., "Hot Wire Chemical Vapor Deposition as a Novel Synthetic Method for Electroactive Organic Thin Films," Mat. Res. Soc. Symp. Proc. 814, I12.19.11-I12.19.16 (2004).
International Preliminary Report on Patentability dated Jan. 10, 2013 for PCT/US2011/041758.

* cited by examiner

CONDUCTIVE POLYMER ON A TEXTURED OR PLASTIC SUBSTRATE

TECHNICAL FIELD

This invention relates to a conductive polymer coating a surface of a textured or plastic substrate.

BACKGROUND

Conductive materials, such as conductive substrates, can be used to build structures with semiconductors to create useful devices. Semiconductors are materials that can contain either an excess of free electrons (N-type) or "holes" (P-type). N- and P-type materials can be joined to form diodes and transistors. Where the two films meet, negative charges can migrate across the junction to the positive side and vice versa, until an equilibrium is reached. This configuration can be used to create light emitting diodes ("LEDs") or photovoltaic ("PV") structures.

When a voltage is applied to an LED, a current flows through the junction in the form of electrons moving in one direction while holes move in the other direction. The migration of ionic charge across the junction causes a higher electrical potential than normal, which affects the way electrons combine with holes. When an electron combines with a hole, it can form an excited state pair, called an exciton, which can quickly release the energy as photons of light. Conversely, when a light of an appropriate wavelength is applied to a photovoltaic structure, photons are absorbed by the molecules, form excitons. The charges of the exciton can separate, moving toward opposite electrodes, thereby establishing a current.

SUMMARY

Semiconductors on common fiber-based papers and ultrathin plastics can be lightweight and foldable for storage and portability, easily shaped for three-dimensional applications, cut to size with scissors or torn by hand, and compatible with roll-to-roll manufacturing. However, such substrates can be easily damaged by common processing agents such as solvents, plasmas, or heat. Advantageously, a conductive polymer coating can be deposited on a substrate that can include a textured surface.

In one aspect, a light absorbing or emitting device can include a substrate with a textured surface and a conductive polymer coating on a surface of the substrate.

In another aspect, a method of making a light absorbing or light emitting device can include providing a plastic or textured substrate including a conductive polymer on a surface of the substrate and depositing an energy converting region capable of converting energy between photoenergy and electric energy on the substrate.

In some embodiments, the textured surface can be porous or fibrous. In certain circumstances, the substrate can be paper or cloth.

In some embodiments, the substrate can be flexible.

In some embodiments, the polymer coating can be conformal to the surface of the substrate.

In some embodiments, the polymer coating can include monomeric units derived from optionally substituted thiophenes, optionally substituted pyrroles or optionally substituted anilines. In some circumstances, the polymer coating can include poly(3,4-ethylenedioxythiophene). In some embodiments, the polymer coating can include at least one dopant.

In some embodiments, the light absorbing or emitting device can further include an electrode and an energy converting region capable of converting energy between photoenergy and electric energy. The energy converting region can be positioned between the electrode and the polymer coating.

In some embodiments, the polymer coating can be an anode and the electrode can be a cathode.

In some embodiments, the energy converting region can include copper phthalocyanine, fullerene-$C_{60}$ or bathocuprine. In some embodiments, the energy converting region can include poly(p-phenylene vinylene), polyfluorene, poly(fluorenylene ethynylene), poly(phenylene ethynylene), polyfluorene vinylene, or polythiophene. In some embodiments, the energy converting region can include at least one material selected from the group consisting of: silicon, copper indium diselenide, zinc oxide, zinc sulfide, zinc selenide, zinc telluride, cadmium oxide, cadmium sulfide, cadmium selenide, cadmium telluride, magnesium oxide, magnesium sulfide, magnesium selenide, magnesium telluride, mercuric oxide, mercuric sulfide, mercuric selenide, mercuric telluride, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, or lead telluride.

In some embodiments, the light absorbing device can be a photovoltaic. In other embodiments, the light emitting device can be a light emitting diode.

In another aspect, a light absorbing device can include a plastic substrate and a conductive polymer coating on a surface of the substrate. In some embodiments, the substrate can be flexible.

In some embodiments, the surface of the substrate can include a plurality of functional groups. The conductive polymer can interact with the plurality of functional groups. The conductive polymer can form a covalent bond with the plurality of functional groups.

In some embodiments, the polymer coating can include monomeric units derived from optionally substituted thiophenes, optionally substituted pyrroles or optionally substituted anilines. The polymer coating can include poly(3,4-ethylenedioxythiophene). The polymer coating can include at least one dopant.

In some embodiments, the light absorbing device can further include an electrode and an energy converting region capable of converting energy between photoenergy and electric energy.

In some embodiments, the polymer coating can be an anode and the electrode can be a cathode.

In some embodiments, the energy converting region can include copper phthalocyanine, fullerene-$C_{60}$ or bathocuprine. In some embodiments, the energy converting region can include poly(p-phenylene vinylene), polyfluorene, poly(fluorenylene ethynylene), poly(phenylene ethynylene), polyfluorene vinylene, or polythiophene. In some embodiments, the energy converting region can include at least one material selected from the group consisting of: silicon, copper indium diselenide, zinc oxide, zinc sulfide, zinc selenide, zinc telluride, cadmium oxide, cadmium sulfide, cadmium selenide, cadmium telluride, magnesium oxide, magnesium sulfide, magnesium selenide, magnesium telluride, mercuric oxide, mercuric sulfide, mercuric selenide, mercuric telluride, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, or lead telluride.

In some embodiments, the light absorbing device can be a photovoltaic.

Other embodiments are within the claims.

DETAILED DESCRIPTION

Figure 1:
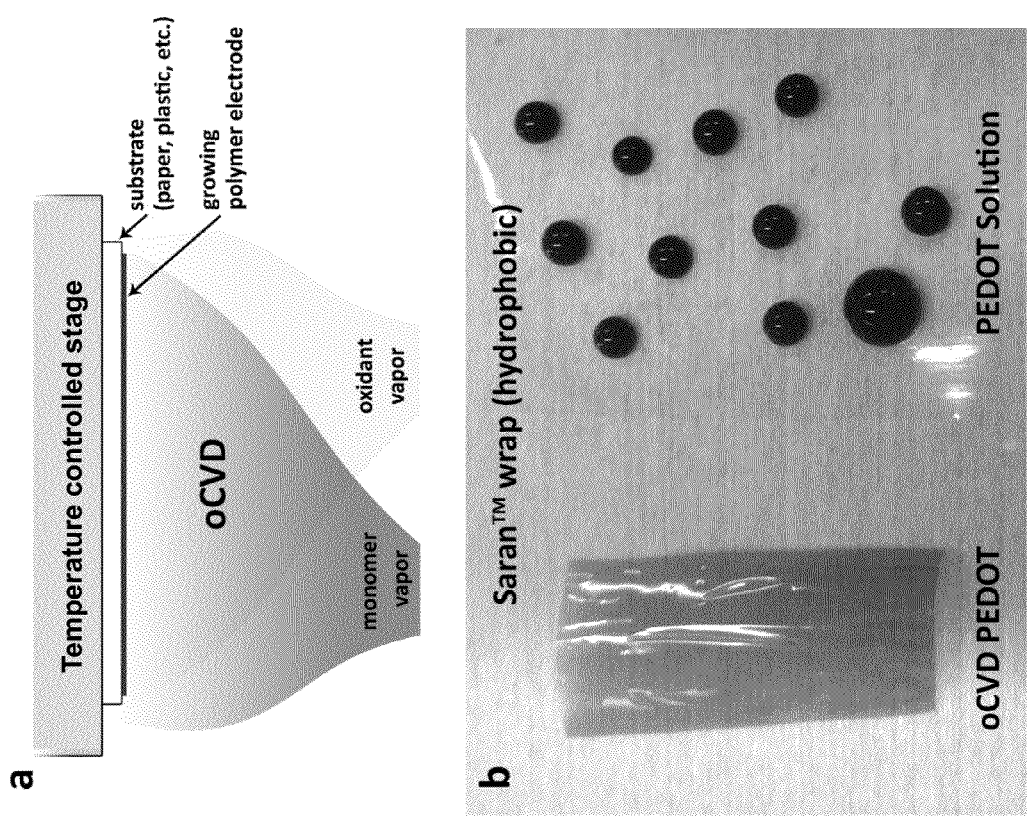
FIG. 1a is a schematic of the oxidative chemical vapor deposition ("oCVD").
FIG. 1b is a picture of poly(3,4-ethylenedioxythiophene) ("PEDOT") applied to SARAN™ wrap by two deposition techniques.

There is a need for development of conducting polymers deposited directly on substrates that are inexpensive, widely available, and compatible with high-throughput manufacturing. In addition, conducting polymers, for example in photovoltaics, on common paper, plastic, or fiber substrates could be seamlessly integrated into existing products (e.g. wall paper, window curtains, newspapers, clothing, etc.). Existing synthesis techniques for conducting polymers can preclude their deposition on some substrates like paper or on top of other materials that are incompatible with solutions-based processing. This fact can limit their application in electronic devices, such as photovoltaics ("PVs") or light emitting diodes ("LEDs"), as a bottom-electrode layer or as a coating on a bottom electrode to facilitate better hole injection. For example, conventional transparent electrodes (e.g. indium tin oxide) can be deposited via sputtering, which is not compatible with processing-sensitive substrates. Progress has been made in the development of solution-processable materials for large-area printing of flexible photovoltaics; however, solution wettability and solvent compatibility requirements can limit substrate choices. The development of a robust vapor-deposition technique for conducting polymers that preserves their high conductivity and is compatible with moisture-sensitive, temperature-sensitive, and mechanically fragile surfaces is needed to broaden their utilization, enabling both improved efficiencies in existing devices and development of new devices on unconventional substrates.

In 1977, the field of conducting polymeric materials, also known as synthetic metals, began with the discovery that polyacetylene conducts electricity. (H. Shirakawa, E. J. Louis, A. G. Macdiamid, C. K. Chiang, and A. J. Heeger, "Synthesis of Electrically Conducting Organic Polymers—Halogen Derivatives of Polyacetylene, (Ch)X," Journal of the Chemical Society-Chemical Communications 16, 578-580 (1977), which is incorporated by reference in its entirety). Efforts to incorporate conducting polymers into electronic devices, including light-emitting diodes (LEDs), electrochromic materials and structures, microelectronics, portable and large-area displays, and photovoltaics have continued since that time. (C. T. Chen, "Evolution of red organic light-emitting diodes: Materials and devices," Chemistry of Materials 16(23), 4389-4400 (2004); A. P. Kulkarni, C. J. Tonzola, A. Babel, and S. A. Jenekhe, "Electron transport materials for organic light-emitting diodes," Chemistry of Materials 16(23), 4556-4573 (2004); A. A. Argun, P. H. Aubert, B. C. Thompson, I. Schwendeman, C. L. Gaupp, J. Hwang, N. J. Pinto, D. B. Tanner, A. G. MacDiamid, and J. R. Reynolds, "Multicolored electrochromism polymers: Structures and devices," Chemistry of Materials 16(23), 4401-4412 (2004); D. K. James and J. M. Tour, "Electrical measurements in molecular electronics," Chemistry of Materials 16(23), 4423-4435 (2004); C. R. Newman, C. D. Frisbie, D. A. da Silva, J. L. Bredas, P. C. Ewbank, and K. R. Mann, "Introduction to organic thin film transistors and design of n-channel organic semiconductors," Chemistry of Materials 16(23), 4436-4451 (2004); M. L. Chabinyc and A. Salleo, "Materials requirements and fabrication of active matrix arrays of organic thin-film transistors for displays," Chemistry of Materials 16(23), 4509-4521 (2004); and K. M. Coakley and M. D. McGehee, "Conjugated polymer photovoltaic cells," Chemistry of Materials 16(23), 4533-4542 (2004), each of which is incorporated by reference in its entirety.)

Polymers, such as polyphenylene, polyaniline, polythiophene, polypyrrole, polycarbazole, or polysilane, can have delocalized electrons along their backbones enabling charge conduction. The conductivity can increase when anions present as dopants in the polymer matrix stabilize positive charges along the chain. Each of the conducting polymers can be substituted with a variety of functional groups to achieve different properties, so new derivatives continue to be synthesized. (J. L. Bredas and R. J. Silbey, Conjugated polymers: the novel science and technology of highly conducting and nonlinear optically active materials (Kluwer Academic Publishers, Dordrecht; Boston, 1991), pp.

xviii, 624 p.; and T. A. Skotheim, R. L. Elsenbaumer, and J. R. Reynolds, Handbook of conducting polymers, 2nd ed. (M. Dekker, New York, 1998), pp. xiii, p. 1097, each of which is incorporated by reference in its entirety.)

One conducting polymer can be poly-3,4-ethylenedioxythiophene (PEDOT) developed by scientists at Bayer AG in Germany. (Bayer, Eur. Patent 339340 (1988); B. L. Groenendaal, F. Jonas, D. Freitag, H. Pielartzik, and J. R. Reynolds, "Poly(3,4-ethylenedioxythiophene) and its derivatives: Past, present, and future," Advanced Materials 12(7), 481-494 (2000); and F. Jonas and L. Schrader, "Conductive Modifications of Polymers with Polypyrroles and Polythiophenes," Synthetic Metals 41(3), 831-836 (1991), each of which is incorporated by reference in its entirety.) It was initially designed to block the β-positions on the thiophene ring to prevent undesirable side reactions. The strategy worked and the ethylene bridge on the molecule can act as a good charge donor to the π-conjugated backbone, giving rise to an unusually high conductivity of 300 S/cm. (G. Heywang and F. Jonas, "Poly(Alkylenedioxythiophene)S—New, Very Stable Conducting Polymers," Advanced Materials 4(2), 116-118 (1992), which is incorporated by reference in its entirety). In addition, PEDOT films in their oxidized state can be extremely stable for conducting polymers and nearly transparent. (M. Dietrich, J. Heinze, G. Heywang, and F. Jonas, "Electrochemical and Spectroscopic Characterization of Polyalkylenedioxythiophenes," Journal of Electroanalytical Chemistry 369(1-2), 87-92 (1994), which is incorporated by reference in its entirety). However, like other conjugated polymers that have a very rigid conformation in order to maintain electron orbital overlap along the backbone, PEDOT can be insoluble. Bayer addressed this problem by using a water soluble polyanion, polystyrene sulfonic acid (PSS), during polymerization as the charge-balancing dopant. The PEDOT:PSS system is marketed as BAYTRON P™ and it has good film forming capabilities, a conductivity of 10 S/cm, good transparency, and extremely good stability. In fact, the films can be heated in air over 100° C. for over 1000 hours with no major decline in conductivity. Studies demonstrate that Bayer's BAYTRON P materials (PEDOT stabilized with polystyrene sulfonate) can have increased conductivity up to 600 S/cm by adding N-methyl-pyrolidone (NMP) or other solvents that reduce screening effects of the polar solvent between the dopant and the polymer main chain. (F. Louwet, L. Groenendaal, J. Dhaen, J. Manca, J. Van Luppen, E. Verdonck, and L. Leenders, "PEDOT/PSS: synthesis, characterization, properties and applications," Synthetic Metals 135(1-3), 115-117 (2003); and J. Y. Kim, J. H. Jung, D. E. Lee, and J. Joo, "Enhancement of electrical conductivity of poly(3,4-ethylenedioxythiophene)/poly(4-styrenesulfonate) by a change of solvents," Synthetic Metals 126(2-3), 311-316 (2002), each of which is incorporated by reference in its entirety.) Bayer's first major customer for BATRON P was Agfa who used the material as an anti-static coating on photographic film. (F. Jonas, W. Kraffi, and B. Muys, "Poly(3,4-Ethylenedioxythiophene)-Conductive Coatings, Technical Applications and Properties," Macromolecular Symposia 100, 169-173 (1995); Bayer, European Pat 440957 (1991); and Agfa, European Patent 564911 (1993), each of which is incorporated by reference in its entirety.) Any spark generated by static electricity can expose film showing up as a bright spot on developed photos. Bayer has since enjoyed utilization of BAYTRON P as an electrode material in capacitors and a material for through-hole plating of printed circuit boards. (F. Jonas and J. T. Morrison, "3,4-polyethylenedioxythiophene (PEDT): Conductive coatings technical applications and properties," Synthetic Metals 85(1-3), 1397-1398 (1997); Bayer, European Patent 533671 (1993); Bayer, European Patent 686662 (1995); Bayer, U.S. Pat. No. 5,792,558 (1996); and F. Jonas and G. Heywang, "Technical Applications for Conductive Polymers," Electrochimica Acta 39(8-9), 1345-1347 (1994), each of which is incorporated by reference in its entirety.) BAYTRON P can also be suitable as a hole-injecting layer in LEDs and photovoltaics, increasing device efficiency by up to 50%. (T. M. Brown, J. S. Kim, R. H. Friend, F. Cacialli, R. Daik, and W. J. Feast, "Built-in field electroabsorption spectroscopy of polymer light-emitting diodes incorporating a doped poly(3,4-ethylene dioxythiophene) hole injection layer," Applied Physics Letters 75(12), 1679-1681 (1999); and G. Greczynski, T. Kugler, M. Keil, W. Osikowicz, M. Fahlman, and W. R. Salaneck, "Photoelectron spectroscopy of thin films of PEDOT-PSS conjugated polymer blend: a mini-review and some new results," Journal of Electron Spectroscopy and Related Phenomena 121(1-3), 1-17 (2001), each of which is incorporated by reference in its entirety.)

Conducting polymer materials can be formed via oxidative polymerization of aniline, pyrrole, thiophene, or their derivatives. (A. Malinauskas, "Chemical deposition of conducting polymers," Polymer 42(9), 3957-3972 (2001), which is incorporated by reference in its entirety). In general, it has not been feasible to process bulk material of these polymers into thin films since they can be insoluble and non-melting, but coating techniques have been developed on substrates including plastic, glass, metal, fabric and micro- and nano-particles. Four main approaches can be utilized to form coatings of anilines, pyrroles, or thiophenes via oxidative polymerization on various materials: electropolymerization of monomers at electrodes, casting a solution of monomer and oxidant on a surface and allowing the solvent to evaporate, immersing a substrate in a solution of monomer and oxidant during polymerization, and chemical oxidation of a monomer directly on a substrate surface that has been enriched with an oxidant.

Historically, electrochemical oxidation on different electrode materials has been the primary route to conducting polyaniline, polypyrrole films, polythiophene, and their derivatives. (E. M. Genies, A. Boyle, M. Lapkowski, and C. Tsintavis, "Polyaniline—a Historical Survey," Synthetic Metals 36(2), 139-182 (1990); L. X. Wang, X. G. Li, and Y. L. Yang, "Preparation, properties and applications of polypyrroles," Reactive & Functional Polymers 47(2), 125-139 (2001); E. Smela, "Microfabrication of PPy microactuators and other conjugated polymer devices," Journal of Micromechanics and Microengineering 9(1), 1-18 (1999); Q. B. Pei, G. Zuccarello, M. Ahlskog, and O. Inganas, "Electrochromic and Highly Stable Poly(3,4-Ethylenedioxythiophene) Switches between Opaque Blue-Black and Transparent Sky Blue," Polymer 35(7), 1347-1351 (1994); R. Kiebooms, A. Aleshin, K. Hutchison, and F. Wudl, "Thermal and electromagnetic behavior of doped poly(3,4-ethylenedioxythiophene) films," Journal of Physical Chemistry B 101(51), 11037-11039 (1997); A. M. White and R. C. T. Slade, "Electrochemically and vapour grown electrode coatings of poly (3,4-ethylenedioxythiophene) doped with heteropolyacids," Electrochimica Acta 49(6), 861-865 (2004); and A. Aleshin, R. Kiebooms, R. Menon, F. Wudl, and A. J. Heeger, "Metallic conductivity at low temperatures in poly(3,4-ethylenedioxythiophene) doped with PF6," Physical Review B 56(7), 3659-3663 (1997), each of which is incorporated by reference in its entirety.) Deposition can take place on an inert electrode material, which can be platinum, but can also be iron, copper, zinc, chrome-gold, lead, palladium, different types of carbon, semiconductors, or on transparent electrodes like indium tin oxide. (D. W. Deberry, "Modification of the Electrochemical and Corrosion Behavior of Stainless-Steels with an Electro-active Coating," Journal of the Electrochemical Society 132 (5), 1022-1026 (1985); G. Mengoli, M. M. Musiani, B. Pelli, and E. Vecchi, "Anodic Synthesis of Sulfur-Bridged Polyaniline Coatings onto Fe Sheets," Journal of Applied Polymer Science 28(3), 1125-1136 (1983); and G. Mengoli, M. T. Munari, and C. Folonari, "Anodic Formation of Polynitroanilide Films onto Copper," Journal of Electroanalytical Chemistry 124(1-2), 237-246 (1981), each of which is incorporated by reference in its entirety). Electrochemical oxidation can take place in an acidic electrolytic solution having anions like chloride, sulfate, fluorosulfonates, and hexafluorophosphate. Deposition can occur as the potential of the electrode is cycled in a range of around −0.6 V to 1 V. Aniline and pyrrole polymerized electrochemically can have conductivities ranging as high as 10 S/cm. Electrochemically deposited polythiophenes, especially the PEDOT derivative, can reach conductivities that are an order of magnitude higher, around 200 to 300 S/cm. (H. Yamato, K. Kai, M. Ohwa, T. Asakura, T. Koshiba, and W. Wernet, "Synthesis of freestanding poly(3,4-ethylenedioxythiophene) conducting polymer films on a pilot scale," Synthetic Metals 83(2), 125-130 (1996), which is incorporated by reference in its entirety.) Using a variety of heteropolyacids as dopants in the electrolyte solution can enable the formation of free-standing films as opposed to coatings on electrodes. Although electrochemical polymerization can produce films that may not be processable, it can have an advantage of making a clean product that does not need to be extracted from a solution. The experimental setup can also be coupled to physical spectroscopic techniques like visible, IR, Raman, and ellipsometry for in-situ characterization.

Chemical oxidation of unsubstituted or substituted aniline, pyrrole, or thiophene can also take place in solution in the presence of an oxidant, for example, iron(III) chloride, iron (III) tosylate, hydrogen peroxide, potassium iodate, potassium chromate, ammonium sulfate, or tetrabutylammonium persulfate (TBAP). (A. Yasuda and T. Shimidzu, "Chemical Oxidative Polymerization of Aniline with Ferric-Chloride," Polymer Journal 25(4), 329-338 (1993); R. Corradi and S. P. Armes, "Chemical synthesis of poly(3,4-ethylenedioxythiophene)," Synthetic Metals 84(1-3), 453-454 (1997); T. Yamamoto and M. Abla, "Synthesis of non-doped poly(3,4-ethylenedioxythiophene) and its spectroscopic data," Synthetic Metals 100(2), 237-239 (1999); F. Tran-Van, S. Garreau, G. Louarn, G. Froyer, and C. Chevrot, "Fully undoped and soluble oligo(3,4-ethylenedioxythiophene)s: spectroscopic study and electrochemical characterization," Journal of Materials Chemistry 11(5), 1378-1382 (2001); D. Hohnholz, A. G. MacDiamid, D. M. Sarno, and W. E. Jones, "Uniform thin films of poly-3,4-ethylenedioxythiophene (PEDOT) prepared by in-situ deposition," Chemical Communications (23), 2444-2445 (2001); A. Pron, F. Genoud, C. Menardo, and M. Nechtschein, "The Effect of the Oxidation Conditions on the Chemical Polymerization of Polyaniline," Synthetic Metals 24(3), 193-201 (1988); M. Angelopoulos, G. E. Asturias, S. P. Ermer, A. Ray, E. M. Scherr, A. G. Macdiamid, M. Akhtar, Z. Kiss, and A. J. Epstein, "Polyaniline—Solutions, Films and Oxidation-State," Molecular Crystals and Liquid Crystals 160, 151-163 (1988); Y. Cao, A. Andreatta, A. J. Heeger, and P. Smith, "Influence of Chemical Polymerization Conditions on the Properties of Polyaniline," Polymer 30(12), 2305-2311 (1989); J. C. Chiang and A. G. Macdiamid, "Polyaniline—Protonic Acid Doping of the Emeraldine Form to the Metallic Regime," Synthetic Metals 13(1-3), 193-205 (1986); and I. Kogan, L. Fokeeva, I. Shunina, Y. Estrin, L. Kasumova, M. Kaplunov, G. Davidova, and E. Knerelman, "An oxidizing agent for aniline polymerization," Synthetic Metals 100(3), 303-303 (1999), each of which is incorporated by reference in its entirety.)

The presence of the strongest of the acid anions (e.g., chloride) in the oxidant can result in the highest conductivities. Chemical oxidation can produce polymers with conductivities comparable to electrochemically deposited films using the same oxidant. (J. A. Walker, L. F. Warren, and E. F. Witucki, "New Chemically Prepared Conducting Pyrrole Blacks," Journal of Polymer Science Part a-Polymer Chemistry 26(5), 1285-1294 (1988), which is incorporated by reference in its entirety.) Generally, polar solvents like alcohols or acetonitrile can be used and reactions can take place over a range of oxidant concentrations and temperatures including 0 to 80° C., under acidic or basic conditions. (L. Yu, M. Borredon, M. Jozefowicz, G. Belorgey, and R. Buvet, Journal of Polymer Science Part A-Polymer Chemistry 10, 2931 (1987), which is incorporated by reference in its entirety). However, these parameters can influence the yield of polymerization and the conductivity of the final product. Solution-based chemical oxidation can produce powder precipitates that are packed into the form of a tablet and then characterized since they are generally insoluble and do not melt. The polymerized material can be rinsed in water, methanol, or acetonitrile to remove unreacted oxidant. Improved conductivities can be obtained after rinsing the material in a solution containing anionic dopants like hydrochloric acid (HCl) or dissolved nitrosonium hexafluorophosphate (NOPF$_6$). Chemical polymerization of aniline or pyrrole can result in conductivities as high as 10 or 50 S/cm, although using TBAP was reported to give polyaniline with a conductivity of 400 S/cm. PEDOT can often have a conductivity of up to 200 or 300 S/cm. A film with these materials can be formed by immersing a substrate in the reaction solution during polymerization.

Polyaniline can also be synthesized via the Ullmann reaction using p-bromoaniline as a precursor, but a low conductivity of only $10^{-6}$ S/cm was measured. (F. Ullmann, Ber Dtsch Chem Ges 36, 2382-2384 (1903), which is incorporated by reference in its entirety). Interfacial polymerization of pyrrole using an aqueous oxidant solution and an organic phase with dissolved monomer can achieve free-standing thin films with conductivities of as high as 50 S/cm. (M. Nakata, M. Taga, and H. Kise, "Synthesis of Electrical Conductive Polypyrrole Films by Interphase Oxidative Polymerization—Effects of Polymerization Temperature and Oxidizing-Agents," Polymer Journal 24(5), 437-441 (1992), which is incorporated by reference in its entirety.)

Dipping a substrate material into a solution containing oxidants like FeCl$_3$ or Fe(OTs)$_3$ and allowing it to dry can yield an oxidant-enriched substrate that can provide a reactive surface that polymerizes volatile monomers including aniline, pyrrole, thiophene, or their derivatives. (B. Winther-Jensen, J. Chen, K. West, and G. Wallace, "Vapor phase polymerization of pyrrole and thiophene using iron(III) sulfonates as oxidizing agents," Macromolecules 37(16), 5930-5935 (2004); J. Kim, E. Kim, Y. Won, H. Lee, and K. Suh, "The preparation and characteristics of conductive poly(3,4-ethylenedioxythiophene) thin film by vapor-phase polymerization," Synthetic Metals 139(2), 485-489 (2003); and B. Winther-Jensen and K. West, "Vapor-phase polymerization of 3,4-ethylenedioxythiophene: A route to highly conducting polymer surface layers," Macromolecules 37(12), 4538-4543 (2004), each of which is incorporated by reference in it entirety.) A conductivity of 50 S/cm can be achieved using this method for polypyrrole and 500 to 1000 S/cm has been reported for PEDOT. Oxidant pretreatment can be extended to glass substrates, polymers, fabrics, and even individual fibers. (S, N. Tan and H. L. Ge, "Investigation into vapour-phase formation of polypyrrole," Polymer 37(6), 965-968 (1996); A. Mohammadi, I. Lundstrom, and O. Inganas, "Synthesis of Conducting Polypyrrole on a Polymeric Template," Synthetic Metals 41(1-2), 381-384 (1991); and C. C. Xu, P. Wang, and X. T. Bi, "Continuous Vapor-Phase Polymerization of Pyrrole. 1. Electrically Conductive Composite Fiber of Polypyrrole with Poly(P-Phenylene Terephthalamide)," Journal of Applied Polymer Science 58(12), 2155-2159 (1995).] Pretreating a surface with iodine vapors can present a solventless polymerization process for polypyrrole, but only low conductivities ranging from $10^{-7}$ to $10^{-1}$ S/cm result. [S. L. Shenoy, D. Cohen, C. Erkey, and R. A. Weiss, "A solvent-free process for preparing conductive elastomers by an in situ polymerization of pyrrole," Industrial & Engineering Chemistry Research 41(6), 1484-1488 (2002), each of which is incorporated by reference in its entirety.)

Another solvent-less deposition process has been demonstrated for polypyrrole that eliminates the step of dip-coating a substrate in an oxidant solution, although it can be restricted to metallic substrates. The surface of metals including copper, iron, gold, and/or palladium can be converted into salts by exposing them to vapors of chlorine, iodine, or bromine and acids with $F^-$, $NO_3^-$, $SO_4^{2-}$, or $ClO_4^-$ anions. Subsequent introduction of monomer vapor can result in polymer films with conductivities of around 1 to 10 S/cm. (G. Serra, R. Stella, and D. De Rossi, "Study of the influence of oxidising salt on conducting polymer sensor properties," Materials Science & Engineering C-Biomimetic Materials Sensors and Systems 5(3-4), 259-263 (1998); A. Nannini and G. Serra, "Growth of Polypyrrole in a Pattern—a Technological Approach to Conducting Polymers," Journal of Molecular Electronics 6(2), 81-88 (1990); F. Cacialli and P. Bruschi, "Site-selective chemical-vapor-deposition of submicron-wide conducting polypyrrole films: Morphological investigations with the scanning electron and the atomic force microscope," Journal of Applied Physics 80(1), 70-75 (1996); and P. Bruschi, F. Cacialli, A. Nannini, and B. Neri, "Low-Frequency Resistance Fluctuation Measurements on Conducting Polymer Thin-Film Resistors," Journal of Applied Physics 76(6), 3640-3644 (1994), each of which is incorporated by reference in its entirety.)

Vacuum deposition of polyaniline films using evaporation can yield conductivities of about $10^{-4}$ S/cm. (T. L. Porter, K. Caple, and G. Caple, "Structure of Chemically Prepared Free-standing and Vacuum-Evaporated Polyaniline Thin-Films," Journal of Vacuum Science & Technology a-Vacuum Surfaces and Films 12(4), 2441-2445 (1994); and T. R. Dillingham, D. M. Cornelison, and E. Bullock, "Investigation of Vapor-Deposited Polyaniline Thin-Films," Journal of Vacuum Science & Technology a-Vacuum Surfaces and Films 12(4), 2436-2440 (1994), each of which is incorporated by reference in its entirety.) Solid polyaniline can be sublimed at temperatures of about 400° C. and pressures of $10^{-5}$ or $10^{-6}$ Torr. Compositional analysis using XPS can show a carbon-to-nitrogen ratio of about 6:1 for the source material. A slightly higher C/N ratio in the deposited film can indicate that short oligomers preferentially sublime.

Plasma-enhanced chemical vapor deposition (PECVD) can be another method of depositing aniline, thiophene or parylene-substituted precursors. However, PECVD can yield low conductivities of only $10^{-4}$ S/cm due to ring breakage or other imperfections caused by the high energies inherent with plasma. (C. J. Mathai, S. Saravanan, M. R. Anantharaman, S. Venkitachalam, and S. Jayalekshmi, "Characterization of low dielectric constant polyaniline thin film synthesized by ac plasma polymerization technique," Journal of Physics D-Applied Physics 35(3), 240-245 (2002); K. Tanaka, K. Yoshizawa, T. Takeuchi, T. Yamabe, and J. Yamauchi, "Plasma Polymerization of Thiophene and 3-Methylthiophene," Synthetic Metals 38(1), 107-116 (1990).; L. M. H. Groenewoud, G. H. M. Engbers, R. White, and J. Feijen, "On the iodine doping process of plasma polymerised thiophene layers," Synthetic Metals 125(3), 429-440 (2001); and L. M. H. Groenewoud, A. E. Weinbeck, G. H. M. Engbers, and J. Feijen, "Effect of dopants on the transparency and stability of the conductivity of plasma polymerised thiophene layers," Synthetic Metals 126(2-3), 143-149 (2002), each of which is incorporated by reference in its entirety.) Another conjugated monomer, 3,4,9,10-perylenetetracarboxylic dianhydride (PTCDA), can fare much better using PECVD, with reported conductivities as high as 50 S/cm. (M. Murashima, K. Tanaka, and T. Yamabe, "Electrical-Conductivity of Plasma-Polymerized Organic Thin-Films—Influence of Plasma Polymerization Conditions and Surface-Composition," Synthetic Metals 33(3), 373-380 (1989), which is incorporated by reference in its entirety.)

Thermally activated hot-wire CVD can be used to polymerize aniline or vinyl-containing monomers, including phenylenevinylene or vinylcarbazole, but no conductivities of these materials have been reported. (G. A. Zaharias, H. H. Shi, and S. F. Bent, "Hot Wire Chemical Vapor Deposition as a Novel Synthetic Method for Electroactive Organic Thin Films," Mat. Res. Soc. Symp. Proc. 814, I12.19.11-I12.19.16 (2004); K. M. Vaeth and K. F. Jensen, "Chemical vapor deposition of thin polymer films used is polymer-based light emitting diodes," Advanced Materials 9(6), 490-& (1997); K. M. Vaeth and K. F. Jensen, "Transition metals for selective chemical vapor deposition of parylene-based polymers," Chemistry of Materials 12(5), 1305-1313 (2000); and M. Tamada, H. Omichi, and N. Okui, "Preparation of polyvinylcarbazole thin film with vapor deposition polymerization," Thin Solid Films 268(1-2), 18-21 (1995), each of which is incorporated by reference it its entirety.) Photo-induced CVD can be used to couple thiophene monomers that were halogenated with bromine or chlorine at the 2- and 5-positions. (T. Sorita, H. Fujioka, M. Inoue, and H. Nakajima, "Formation of Polymerized Thiophene Films by Photochemical Vapor-Deposition," Thin Solid Films 177, 295-303 (1989), which is incorporated by reference in its entirety.) Although the monomers may couple at the halogenated positions, only relatively low conductivities of $10^{-13}$ S/cm can be achieved. However, dibrominated PEDOT can polymerize upon heating and makes films with a conductivity of 20 S/cm. (H. Meng, D. F. Perepichka, M. Bendikov, F. Wudl, G. Z. Pan, W. J. Yu, W. J. Dong, and S. Brown, "Solid-state synthesis of a conducting polythiophene via an unprecedented heterocyclic coupling reaction," Journal of the American Chemical Society 125 (49), 15151-15162 (2003), which is incorporated by reference in its entirety.)

Norbornene and a ruthenium(IV)-based catalyst volatilized in a chamber under low pressure can result in a film of polynorbonene on a silicon substrate. (H. W. Gu, D. Fu, L. T. Weng, J. Xie, and B. Xu, "Solvent-less polymerization to grow thin films on solid substrates," Advanced Functional Materials 14(5), 492-500 (2004), which is incorporated by reference in its entirety.) The monomer can undergo a ring-opening metathesis polymerization mechanism when contacted by the catalyst. (T. M. Trnka and R. H. Grubbs, "The development of L2X2Ru=CHR olefin metathesis catalysts: An organometallic success story," Accounts of Chemical Research 34(1), 18-29 (2001), which is incorporated by reference in it entirety.) The technique can be repeated based on the same polymerization mechanism using 1,3,5,7-cyclooctatetetraene to form polyacetylene. (H. W. Gu, R. K. Zheng, X. X. Zhang, and B. Xu, "Using soft lithography to pattern highly oriented polyacetylene (HOPA) films via solvent-less polymerization," Advanced Materials 16(15), 1356 (2004), which is incorporated by reference in its entirety.) The deposition can be slow and an electrical conductivity was not reported.

Electropolymerization of EDOT has been the most commonly used deposition technique for PEDOT and other conducting polymers. Electrode coatings and free-standing PEDOT films with conductivities around 300 S/cm can be created, which are an order of magnitude higher than the conductivity of polypyrrole films deposited using the same method. Chemical oxidative polymerization of EDOT in a solution containing oxidants like $FeCl_3$ or $Fe(OTs)_3$ can yield PEDOT material with similar conductivities. The reaction mixture can be cast on a surface leaving a polymerized film as the solvent evaporates and films may also be deposited on substrates that are immersed in the polymerizing reaction mixture. However, like other conjugated polymers that adopt a very rigid conformation in order to maintain electron orbital overlap along the backbone, PEDOT can be insoluble and does not melt, precluding subsequent processing. Bayer circumvented this problem by using a water soluble polyanion, polystyrene sulfonic acid (PSS), during polymerization as the charge-balancing dopant. The aqueous PEDOT: PSS system, now marketed as BAYTRON P™, has a good shelf life and film forming capabilities while maintaining its transparency, stability, and a conductivity of 10 S/cm. However, the PSS dopant can incorporate a non-conducting matrix material and can make the coating solution acidic. This fact can lead to different film forming characteristics depending on the ability of the solution to wet different materials like glass, plastic, or other active layers in a device. In addition, some devices simply cannot be compatible with wet processing techniques.

Therefore, the development of a robust vapor-deposition technique for PEDOT films could simplify the coating process on a variety of organic and inorganic materials since it would not depend on evenly wetting the substrate surface. Vapor-phase deposition could also provide uniform coatings on substrates with high surface areas due to roughness or fibrous and porous morphologies. Increasing the effective surface area of devices can improve operating efficiencies and coating unconventional surfaces like paper, fabric, or small particles can lead to the innovation of new devices. Vapor-phase techniques using oxidant-enriched substrates which have been coated with solutions of Fe(III) tosylate and allowed to dry have been developed. Exposing the treated surface to EDOT vapors can result in the polymerization of films with conductivities reported to be as high as 1000 S/cm. (J. Kim, E. Kim, Y. Won, H. Lee, K. Suh, Synthetic Metals 139, 485 (2003); and B. Winther-Jensen, K. West, Macromolecules 37, 4538 (2004), each of which is incorporated by reference in its entirety.)

A method of making a conducting material can be a chemical vapor deposition (CVD) process that forms thin films of electrically active polymers. (See, for example, U.S. Pat. No. 7,618,680 and references cited therein, each of which is incorporated by reference in its entirety.) In one embodiment, the technique can make PEDOT that has a conductivity over 4 S/cm and can be spectroscopically comparable to commercial product deposited from the solution phase. This technique can be applicable to other oxidatively polymerized conducting materials like polypyrrole, polyaniline, polythiophene, or their substituted derivatives. Side reactions stemming from acid generation during oxidative polymerization can lead to bond breakage in the monomer and the formation of unconjugated oligomers that can result in films with low conductivities. These unwanted reactions can be minimized via three different methods: introducing pyridine as a base, heating the substrate (e.g., the surface to be coated), and applying a bias to the sample stage.

CVD can be an all-dry process for depositing thin films of conducting polymers that are currently available on the market only as solution-based materials. Commercial PEDOT films deposited onto anodes from solution can facilitate hole injection and can result in significant efficiency gains on the order of 50% for organic LED and photovoltaic devices. Using CVD to provide uniform coatings on rough electrode surfaces can lead to further improvements in efficiency by increasing the effective surface area while avoiding sharp electrode features from protruding through the film and shorting the device. The absence of the acidity associated with solution-based films can reduce corrosion of neighboring layers that can cause early device failure. Moderate stage temperatures and vapor phase coating can allow depositing conducting films on a wide range of unconventional organic and inorganic high surface-area materials, including paper, fabric, and small particles. CVD can be a significant tool for organic semiconductor manufacturers seeking capabilities to incorporate conducting polymers in all-dry fabrication processes.

Polymerization of EDOT.

The oxidation of 3,4-ethylenedioxythiophene (EDOT) to form PEDOT can be analogous to the oxidative polymerization of pyrrole, which has been described with a mechanism proposed by Diaz. (S. Sadki, P. Schottland, N. Brodie, G. Sabouraud, Chemical Society Reviews 29, 283 (2000); and E. M. Genies, G. Bidan, A. F. Diaz, Journal of Electroanalytical Chemistry 149, 101 (1983), each of which is incorporated by reference in its entirety.) The first step can be the oxidation of EDOT, which generates a radical cation that has several resonance forms. The combination of two of these radicals and subsequent deprotonation can form a neutral dimer. Substitution of the EDOT thiophene ring at the 3,4-positions can block β-coupling, allowing new bonds only at the 2,5-positions. The alternating single and double bonds of the dimer can give π-conjugated or delocalized electrons, making it easier to remove an electron from the dimer relative to the monomer. In other words, the dimer can have a lower oxidation potential than the monomer. The dimer can be oxidized to form another positively charged radical that can undergo coupling and deprotonation with other monomeric or oligomeric cations. Eventually, chains of neutral PEDOT with alternating single and double bonds can be formed.

The neutral PEDOT polymer can be further oxidized to create a positive charge along the backbone every three or four chain segments. A "dopant" anion can ionically bind to the polymer and balance the charge. The oxidized form of PEDOT can be a conducting form of the polymer. Neutral PEDOT can have a dark blue/purple color and the doped form can be very light blue.

The acidic strength of the reaction environment can be one aspect of the mechanism to be considered, because it can have a number of effects on the polymerization conditions, including the oxidation potential of the oxidant, which can be decreased with the addition of a base. Some acidification of the reaction mixture can speed the rate of polymerization through an acid-initiated coupling mechanism, which can contribute to additional chain growth.

One caveat of acid-initiated coupling can be that the resulting polymer is not conjugated and may not be electrically conducting without subsequent oxidation. If the acidic strength is too high, it can be possible to saturate the 3,4- positions of a reacting EDOT radical, resulting in a trimer with broken conjugation, quenching electrical conductivity. (T. F. Otero, J. Rodriguez, Electrochimica Acta 39, 245 (1994), which is incorporated by reference in its entirety).

Evidence has also been presented that very acidic conditions can break the dioxy bridge on the EDOT ring leading to imperfections that reduce conductivity. (B. Winther-Jensen, K. West, Macromolecules 37, 4538 (2004), which is incorporated by reference in its entirety). Adding pyridine as a base to the system to achieve an acidic strength strong enough to maintain the oxidation potential of the oxidant, but not strong enough to cause bond cleavage of the monomer, can yield PEDOT films with conductivities reported to be as high as 1000 S/cm.

Oxidative Chemical Vapor Deposition (oCVD).

oCVD can generally take place in a reactor. Precursor molecules, consisting of a chemical oxidant and a monomer species, can be fed into the reactor. The oxidant can be a metal-containing oxidant. This process can take place at a range of pressures from atmospheric pressure to low vacuum. In certain embodiments, the pressure can be about 760 Torr; in other embodiments, the pressure can be about 300 Torr; in other embodiments, the pressure can be about 30 Torr; in other embodiments, the pressure can be about 3000 mTorr; in yet other embodiments, the pressure can be about 300 mTorr. Chemical oxidant species can be extremely heavy, but can be sublimed onto a substrate surface using a carrier gas and a heated, porous crucible installed inside the reactor directly above the sample stage. The oxidant source can also be installed on the exterior of the vacuum chamber. Evaporation of the oxidant can also take place in a resistively heated container inside the reaction chamber. In certain embodiments, evaporation of the oxidant can take place in a resistively heated container inside the reaction chamber. The oxidant can be underneath the substrate surface to be coated. The monomer species can be provided to the substrate surface, which may have been previously exposed to the oxidant. The monomer species can be provided to the reactor, for example, in vapor form. In certain embodiments, the monomer species can be delivered from a source external to the reactor. The oxidant can form a thin, conformational layer on the substrate surface. The conformational layer can react with monomer molecules as they adsorb. An acid-catalyzed side reaction can lead to broken monomer bonds and non-conjugated oligomers can inhibit the formation of conjugated, electrically active polymer. These side reactions may be reduced using one or more the following techniques: introducing a base, such as pyridine, to react with any acid that is formed in situ; heating the substrate to temperatures above about 60° C., 70° C., 80° C. or 90° C., for example, to accelerate evaporation of the acid as it is formed; and biasing the substrate with a positive charge using a DC power supply to favor the oxidation of monomeric and oligomeric species adsorbed on the substrate. Biasing can also provide directionality to charged oligomers during polymer chain growth. The ordering of the polymer chains that results can contribute to higher electrical conductivities.

The deposited film then can be heated, sometimes under vacuum (e.g., −15 mmHg, −30 mmHg, or −45 mmHg), to remove unreacted monomer. Rinsing the dried film in a solvent, for example, methanol or water, can remove reacted metal-containing oxidant from the film, in some cases can change the color from hazy yellow to a clear sky blue hue. Rinsing the dried film in a solution of "dopant" ionic salts, such as $NOPF_6$ in acetonitrile, can promote the oxidized form of the conducting polymer by balancing positive charges that are induced along the polymer chain with anions from the salt.

Methods of Making a Conducting Material.

A method of making a conducting material can include providing a substrate. The substrate can have a surface area greater than area the substrate occupies. The substrate can have a surface area that is greater than 1.5 times, greater than 2 times, greater than 5 times, greater than 10 times, greater than 25 times, greater than 50 times, greater than 100 times, or greater than 500 times the area the substrate occupies.

In certain embodiments, the substrate can have a texture. For example, the texture can be fibrous, porous, granulated, patterned, ridged, stippled, corrugated, perforated, milled, or brushed. The substrate can include more than one texture, or a texture can be present on only a portion of the substrate. The substrate can be flexible.

The substrate can be a fibrous substrate, for example, paper or fabric. A fibrous substrate can include fibers, threads or filaments. Paper can be a felted sheet of fibers deposited on a screen from a water suspension. Examples of paper can include rice paper, tracing paper, tissue paper, toilet paper, bathroom tissue, facial tissue, newspaper, wax paper, paper currency, banana paper, inkjet paper, wallpaper, sandpaper, cotton paper, construction paper, book paper, printer paper, parchment, fish paper, TYVEK™, wove paper, buckypaper, and paper towels. Paper can be made from a number of materials including plant fibers, for example, fibers from wood, cotton, rice, wheat, bark, bamboo, hemp, or papyrus. Paper can also be made from materials including carbon, graphene oxide, or plastic. Products of any of these materials, or combinations of any of these materials can also be used to form paper.

Fabric can be a material made by weaving, felting or knitting natural or synthetic fibers or filaments. A fabric can be made from natural sources, which can include for example, from carbon, cotton, silk, fleece, fur, leather, angora, mohair, alpaca wool, satin, goat wool, horse hair, flax, camel hair, cashmere, vicuna fleece, llama wool, milk proteins, grass, hemp, rush, straw, bamboo or wood. The fabrics made from natural sources can include linen, taffeta, tweed, wool, silk, canvas, cheesecloth, gauze, corduroy, denim, moleskin, poplin, sacking, terry cloth, lyocell, or velvet. Minerals, such as asbestos or basalt, can be used to make fabrics. Fabrics can be made from glass or metals, such as gold, silver, titanium, aluminum, copper or steel. A fabric can be synthetic, for example, satin, rayon, acrylic, acetate, nylon, aramid, latex, polyester, spandex, chiffon, polyvinyl chloride, sateen, olefin, ingeo, lurex, tulle, or viscose. A fabric can be a blend of natural materials, synthetic materials, or both.

The substrate can also be porous, meaning it can include pores or holes. A porous material can include, for example, plastic, sponge, ceramic, wood, clay, carbon or silicon.

The substrate can be transparent or semi-transparent. The substrate can allow greater than 90%, greater than 80%, greater than 70%, greater than 60%, greater than 50% or greater than 25% of light that contacts the substrate to pass through the substrate.

The light passing through the substrate can be light within the solar spectrum. The light can include electromagnetic radiation with wavelengths falling in the visible spectrum, the ultraviolet spectrum and the infrared spectrum. More specifically, the light can include electromagnetic radiation with a wavelength of 100 to 280 nm, 280 to 315 nm, 315 to 400 nm, 400 to 700 nm, 700 nm to 1 μm, 1 μm to 2 μm, or 2 μm to 3 μm.

The light can include electromagnetic radiation classified as ultraviolet C, ultraviolet B, ultraviolet A, visible, infrared A, infrared B or infrared C.

The substrate can be free from pre-treatments. The substrate can also be free from solvents or wetting agents. The substrate can be hydrophobic or hydrophilic.

The substrate can be fragile, for example, it can be easily folded, shaped, torn or cut. The substrate can also be easily damaged by common processing agents such as solvents, plasmas or heat. The substrate can be flexible, e.g., easily bent, folded or creased. A flexible substrate can be brittle or non-brittle. The substrate can be stretchable.

The method of making a conducting material can include coating at least a portion of a surface of the substrate with a conductive polymer. Coating at least a portion of the substrate with a conductive polymer can include oxidative chemical vapor deposition, which can take place in a reactor or a reaction chamber. Coating at least a portion of a surface of the substrate with a conductive polymer can include contacting the substrate with an oxidant. The oxidant can be gaseous. The oxidant can be vaporized to form a gaseous oxidant. Vaporizing can include sublimation using a carrier gas and a heated, porous crucible installed inside the reactor directly above the sample stage where the substrate can be placed. Vaporization can also take place in a resistively heated container inside the reaction chamber underneath the substrate surface.

The oxidant can also be a metal-containing oxidant, for example, iron(III) chloride, iron(III) tosylate, potassium iodate, potassium chromate, ammonium sulfate or tetrabutylammonium persulfate. The oxidant can have an oxidation potential between about 0.5 V and about 1.0 V, more specifically, about 0.75 V. The entire surface can be contacted with the oxidant or a portion of the surface can be contacted. Contacting the substrate with the oxidant can form an oxidant-enriched portion of the substrate. The portion of the substrate can be a portion of the surface.

The method of making a conducting material can include heating the oxidant enriched portion of the substrate. Heating the oxidant enriched portion of the substrate can accelerate evaporation of acid that may be formed on the substrate. The substrate can be heated by heating a stage on which the substrate is placed, heating the reaction chamber or other methods known to those of skill in art for heating a substrate.

Acid-catalyzed side reactions during oCVD can lead to broken monomer bonds and/or non-conjugated oligomers, which can inhibit the formation of conjugated, electrically active polymer. However, these side reactions may be reduced using one or more the following techniques: introducing a base, such as pyridine, to react with any acid that is formed in situ; heating the substrate to temperatures above about 60° C., 70° C., 80° C. or 90° C., for example, to accelerate evaporation of the acid as it is formed; and biasing the substrate with a positive charge using a DC power supply to favor the oxidation of monomeric and oligomeric species adsorbed on the substrate. Biasing also provided directionality to charged oligomers during polymer chain growth. The ordering of the polymer chains that results may contribute to higher electrical conductivities.

The method of making a conducting material can include contacting the oxidant enriched surface with a base. The base can be a gaseous base. The base can be an optionally substituted pyridine.

The method of making a conducting material can include contacting the oxidant enriched portion of the substrate with a monomer. The monomer may be gaseous. The monomer can be vaporized to form a gaseous monomer. Vaporizing can include sublimation. The monomer can be vaporized inside the reaction chamber or gaseous monomer can be provided from a source external to the reaction chamber. The monomer can be an optionally substituted thiophene, optionally substituted pyrrole, optionally substituted anilines, phenanthrolines, furans, heteroarenes including more than one ring heteroatom, benzenoid arenes, non-benzenoid aromatic compounds, or combinations thereof. The monomer can be 3,4 ethylenedioxythiophene. Contacting the oxidant-enriched surface with the monomer can result in polymerization of the monomer and the formation of a polymer coated surface.

In certain embodiments, the deposited film then may be heated, sometimes under vacuum (e.g., 15 mmHg, 30 mmHg, or 45 mmHg), to remove unreacted monomer.

Following polymerization, the polymer coated surface can be washed with a solvent, which can be, for example, water, methanol, ethanol, isopropanol, acetonitrile or mixtures thereof. In some cases, this changes the color from hazy yellow to a clear sky blue hue.

A gaseous precursor, such as an epoxide, can be thermally activated to provide an initiator for the oxidative polymerization of the conductive polymer. The precursor can be thermally activated with the use of a hot filament. The polymer coating can include bicyclic thiophene, for example, a heterobicyclic thiophene such as poly(3,4-ethylenedioxythiophene).

The method of making a conducting material can include contacting the conductive polymer coated substrate with a dopant, most commonly a dopant anion. A dopant can contribute to the conductivity of the polymer coating. A dopant anion can provide stability enhancement for electroactive polymers. The dopant may be any compound as long as it has a doping ability (i.e. stabilizing ability). For example, an organic sulfonic acid, an inorganic sulfonic acid, an organic carboxylic acid or salts thereof such as a metal salt or an ammonium salt may be used. More specifically, it can include chloride, bromide, iodide, fluoride, phosphate, sulfonate or nitrosonium hexafluorophosphate. The dopant can be added to the oxidizing agent and/or the monomer, can be allowed to be present together at the time of polymerization or can be added by other methods known to those of skill in the art. In certain embodiments the dopant molecule comprises aqueous solutions of the acids selected from the group consisting of phosphoric acid, triflic acid, hydrochloric acid, methanesulfonic acid, oxalic acid, pyruvic acid, or acrylic acid, or a poly anion incorporating one or more of the aforementioned types of acids. In certain embodiments, rinsing the dried film in a solution of "dopant" ionic salts, such as $NOPF_6$ in acetonitrile, can promote the oxidized form of a conducting polymer by balancing positive charges that are induced along the polymer chain with anions from the salt.

Once the conductive polymer is formed, the conductive polymer coated surface can be heated under vacuum to dry. The surface can be heated using a heated stage, heating the reaction chamber, or heated by other methods known to those of skill in the art.

Figure 7:
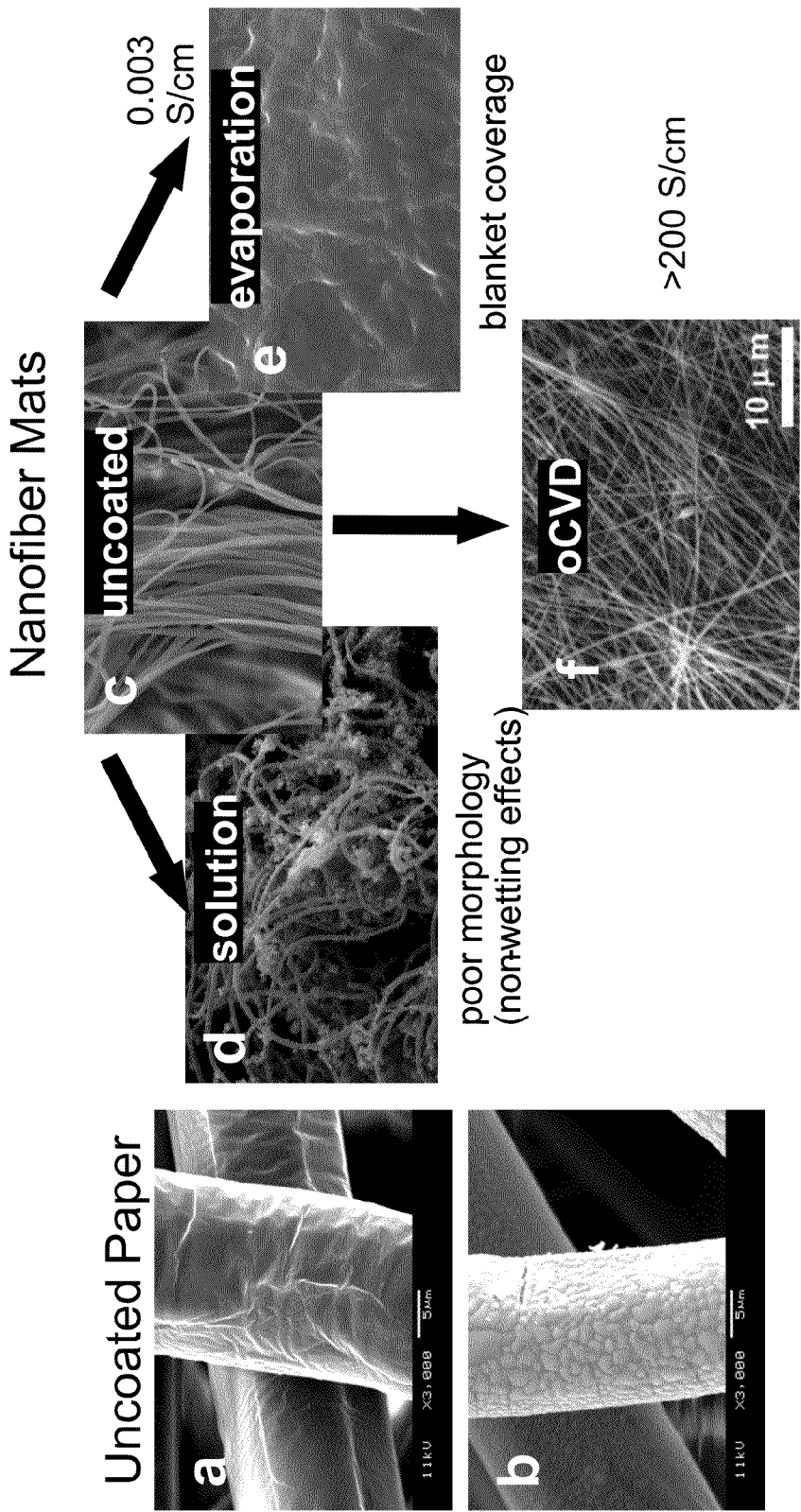
FIG. 7 shows a conductive polymer conforming to fibers of substrates.

Substrates can have textured surfaces that require fabrication processes capable of conformally coating complex geometries. The conductive polymer can be conformal to the substrate. For example, the polymer can form a layer directly around the fibers of the substrate (FIG. 7f), can form a layer directly in holes of a porous or perforated substrate (not shown), or can form a layer directly over granulated, ridged, patterned, stippled, corrugated, milled, or brushed substrates (not shown). This allows the conductive polymer to get into the "nooks and crannies" of the substrate. The conductive polymer coating can have essentially the same shape and contours of the substrate, for example, forming a sleeve on the fibers. This is in contrast to conductive polymers deposited on substrates by techniques other than oCVD, where the conductive polymer can blanket the substrate (FIG. 7e) or can have irregular dimensions along the texture of the substrate and demonstrate poor morphology (FIG. 7d).

The conductive polymer can directly conform to the substrate. Pre-treatment steps or protective layers may not be required for the conductive polymer to adhere to the substrate. Pre-treatment steps can include exposing the substrate to solvents or wetting agents. The conductive polymer can have a high degree of adhesion to the substrate. The high degree of adhesion can result from in situ covalent bonding, or chemical grafting, of the polymer to a substrate possessing functional groups upon film formation. Functional groups can be present on polystyrenes or polyethylene terephthalates, for example. The high degree of adhesion can be advantageous for roll-to-roll processing and for flexible and stretchable electronics, where mechanical stresses could otherwise result in cracking or delamination.

The conductive polymer coating can be of a uniform thickness (i.e., said thickness does not vary more than 10% over the surface of the article; or by more than 5% over the surface of the article; or by more than 1% over the surface of the article). The thickness of the polymer coating can be between 0 and 100 nm, for example, between 0 and 10 nm, between 10 and 20 nm, between 20 and 30 nm, between 30 and 40 nm, between 40 and 50 nm, between 50 and 75 nm, between 75 and 100 nm. The thickness of the polymer coating can be greater than 100 nm. More specifically, the thickness of the polymer coating can be 5 nm, 10 nm, 15 nm, 20 nm, 25 nm, 30 nm, 40 nm, 50 nm, 60 nm, 70 nm, 75 nm, 80 nm, 90 nm or 100 nm.

The conductive polymer coating can have a mass per surface area of less than about 500 $\mu g/cm^2$, less than about 100 $\mu g/cm^2$, less than about 50 $\mu g/cm^2$, less than about 10 $\mu g/cm^2$, or less than about 5 $\mu g/cm^2$. The required mass per surface area depends on the specific surface area of the substrate to be coated. A smooth flat substrate, 1 $cm^2$ in area can require coverage of only 1 $cm^2$ of area and thus the specific surface area of 1 $cm^2/cm^2$. However, a 1 $cm^2$ section of fabric can have a specific surface area greater than 1 because each surface-accessible fiber of the fabric must be coated. The gaseous reactants of the inventive processes can penetrate into the fabric and coat these internal surfaces. The specific surface area can depend on the packing density of the fibers and total thickness of the fabric. The thickness (cm) of the coating multiplied by the specific surface area ($cm^2/cm^2$) of the fabric and the density of the coating ($g/cm^3$) will yield the mass per surface area ($g/cm^2$).

The methods of making a conducting material can have several advantages. In addition to achieving polymerization from vapor-phase reactants and conformal thin-film formation in a single step, the method can impart excellent substrate adhesion through in situ covalent bonding (chemical grafting) and can allow direct control over thickness, dopant concentration, work function, and conductivity. (Im, S. G., Yoo, P. J., Hammond, P. T., Gleason, K. K., Grafted conducting polymer films for nano-patterning onto various organic and inorganic substrates by oxidative chemical vapor deposition. Adv. Mater. 19, 2863 (2007); Im, S. G., Gleason, K. K., Systematic control of the electrical conductivity of poly(3,4-ethylenedioxythiophene) via oxidative chemical vapor deposition. Macromolecules 40, 6552 (2007); and Im, S. G., Gleason, K. K., Olivetti, E. A., Doping level and work function control in oxidative chemical vapor deposited poly(3,4-ethylenedioxythiophene). Appl. Phys. Lett. 90 (2007), each of which is incorporated by reference in its entirety). Films can form at low substrate temperatures (20-100° C.), moderate vacuum (~0.1 Torr), and at rates that can exceed 10 nm $min^{-1}$. Moreover, since there are no solubility requirements, the polymer coated substrates may not be bound by the molecular weight and dopant restrictions that can limit conductivity in solution-cast polymers. (Ha, Y. H. et al., Towards a transparent, highly conductive poly(3,4-ethylenedioxythiophene). Adv. Funct. Mater. 14, 615 (2004), which is incorporated by reference in its entirety). Finally, the method can be achieved by all dry processing.

Conducting polymers can be fabricated directly on ultra-lightweight "everyday" substrates, including as-purchased fiber-based papers (~0.001 $g cm^2$, ~40-$\mu$m thick), without any pretreatment steps or protecting layers. Photovoltaics formed using this technique can demonstrate power-to-weight ratios over 500 W $kg^{-1}$. The highly conductive polymer electrodes (100-1000 S $cm^{-1}$) can be simultaneously synthesized and deposited without solvents as conformal, transparent thin films at low temperature via oxidative chemical vapor deposition (oCVD). The polymer electrodes can retain their electrical integrity even after severe deformation: >1000 flexing cycles at <5 mm radius, >100 creasing cycles, and stretching to ~200%. The polymer electrodes can exhibit comparable performance to conventional ITO-based devices, can be flexed >100 times while maintaining nearly 100% of their starting efficiencies, and can retain power generation in air when folded into large-area three-dimensional structures.

Conducting Material.

Figure 9:
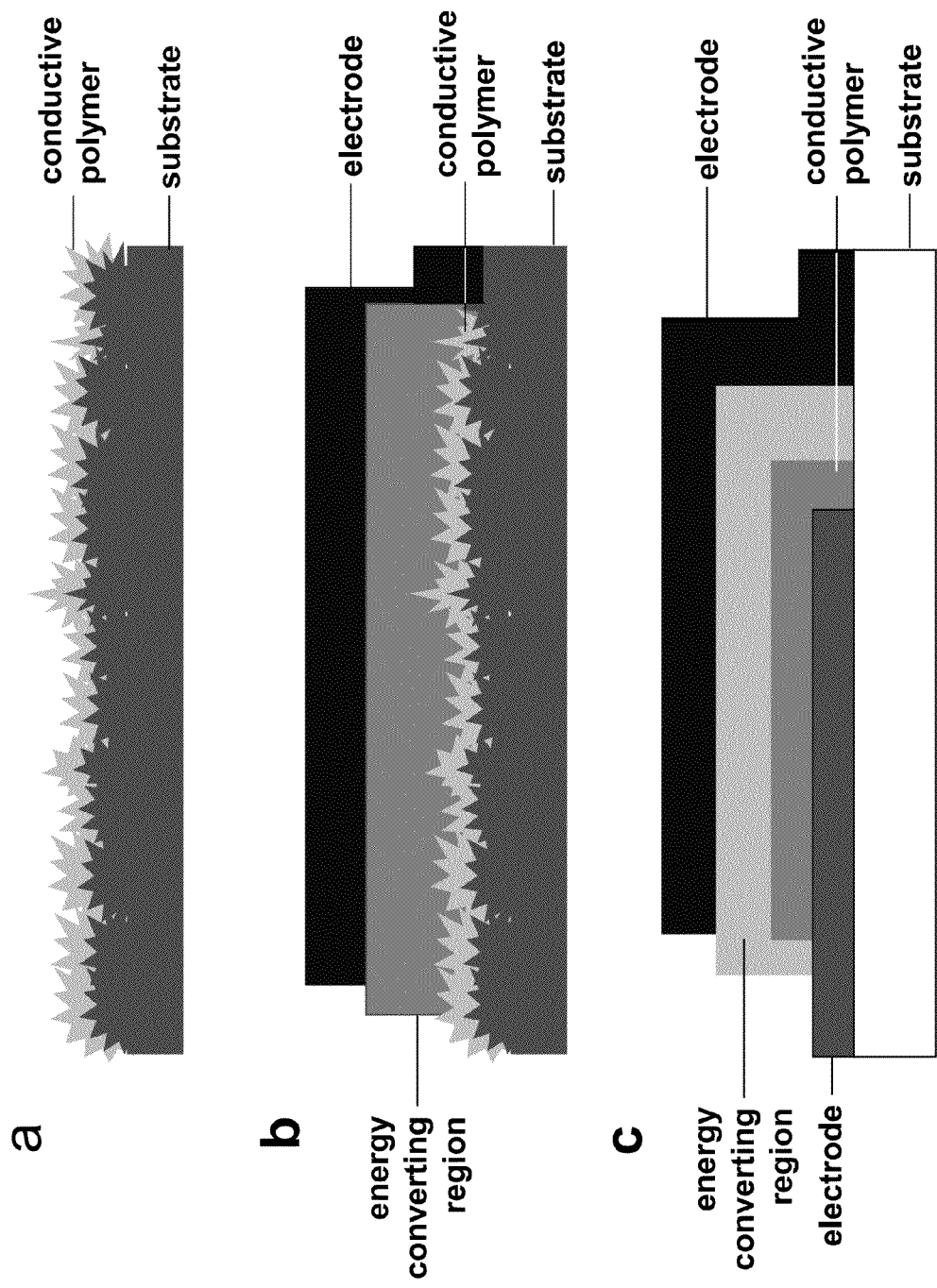
FIG. 9 illustrates exemplary configurations including a conducting material.

A conducting material can include a substrate and a conductive polymer coating on a surface of the substrate (FIG. 9a).

The substrate can have a surface area greater than area the substrate occupies. The substrate can have a surface area that is greater than 1.5 times, greater than 2 times, greater than 5 times, greater than 10 times, greater than 25 times, greater than 50 times, greater than 100 times, or greater than 500 times the area the substrate occupies.

The substrate can have a texture. For example, the texture can be fibrous, porous, granulated, patterned, ridged, stippled, corrugated, perforated, milled or brushed. The substrate can include more than one texture, or a texture can be present on only a portion of the substrate. The substrate can be flexible.

The substrate can be a fibrous substrate, for example, paper or fabric. A fibrous substrate can include fibers, threads or filaments. Paper can be a felted sheet of fibers deposited on a screen from a water suspension. Examples of paper can include rice paper, tracing paper, tissue paper, toilet paper, bathroom tissue, facial tissue, newspaper, wax paper, paper currency, banana paper, inkjet paper, wallpaper, sandpaper, cotton paper, construction paper, book paper, printer paper, parchment, fish paper, TYVEK™, wove paper, buckypaper, or paper towels. Paper can be made from a number of materials including plant fibers, for example, fibers from wood, cotton, rice, wheat, bark, bamboo, hemp, or papyrus. Paper can also be made from materials including carbon, graphene oxide, or plastic. Products of any of these materials, or combinations of any of these materials can also be used to form paper.

Fabric can be a material made by weaving, felting or knitting natural or synthetic fibers or filaments. A fabric can be made from natural sources, which can include for example, from carbon, cotton, silk, fleece, fur, leather, angora, mohair, alpaca wool, satin, goat wool, horse hair, flax, camel hair, cashmere, vicuna fleece, llama wool, milk proteins, grass, hemp, rush, straw, bamboo or wood. The fabrics made from natural sources can include linen, taffeta, tweed, wool, silk, canvas, cheesecloth, gauze, corduroy, denim, moleskin, poplin, sacking, terry cloth, lyocell, or velvet. Minerals, such as asbestos or basalt, can be used to make fabrics. Fabrics can be made from glass or metals, such as gold, silver, titanium, aluminum, copper or steel. A fabric can be synthetic, for example, satin, rayon, acrylic, acetate, nylon, aramid, latex, polyester, spandex, chiffon, polyvinyl chloride, sateen, olefin, ingeo, lurex, tulle, or viscose. A fabric can be a blend of natural materials, synthetic materials, or both.

The substrate can also be porous, meaning it can include pores or holes. A porous material can include, for example, plastic, sponge, ceramic, wood, clay, carbon or silicon.

The substrate can be transparent or semi-transparent. The substrate can allow greater than 90%, greater than 80%, greater than 70%, greater than 60%, greater than 50% or greater than 25% of light that contacts the substrate to pass through the substrate.

The light passing through the substrate can be light within the solar spectrum. The light can include electromagnetic radiation with wavelengths falling in the visible spectrum, the ultraviolet spectrum and the infrared spectrum. More specifically, the light can include electromagnetic radiation with a wavelength of 100 to 280 nm, 280 to 315 nm, 315 to 400 nm, 400 to 700 nm, 700 nm to 1 μm, 1 μm to 2 μm, or 2 μm to 3 μm. The light can include electromagnetic radiation classified as ultraviolet C, ultraviolet B, ultraviolet A, visible, infrared A, infrared B or infrared C.

The substrate can be free from pre-treatments. The substrate can also be free from solvents or wetting agents. The substrate can be hydrophobic or hydrophilic.

The substrate can be fragile, for example, it can be easily folded, shaped, torn, or cut. The substrate can also be easily damaged by common processing agents such as solvents, plasmas or heat. The substrate can be flexible, e.g., easily bent, folded or creased. A flexible substrate can be brittle or non-brittle. The substrate can be stretchable.

The conductive polymer can include monomeric units derived from optionally substituted thiophenes, optionally substituted pyrroles, optionally substituted anilines, phenanthrolines, furans, heteroarenes including more than one ring heteroatom, benzenoid arenes, non-benzenoid aromatic compounds, or combinations thereof. The polymer coating can include bicyclic thiophene, for example, a heterobicyclic thiophene such as poly(3,4-ethylenedioxythiophene). Poly (3,4-ethylenedioxythiophene) can be made up of monomeric units derived from 3,4 ethylenedioxythiophene.

The conductive polymer can be a p-type semiconductor and have an excess of holes (i.e. spaces that accept electrons). The conductive polymer can be an n-type semiconductor and have an excess of free electrons.

Substrates can have textured surfaces that require fabrication processes capable of conformally coating complex geometries. The conductive polymer can be conformal to the substrate. For example, the polymer can form a layer directly around the fibers of the substrate (FIG. 7f), can form a layer directly in holes of a porous or perforated substrate (not shown), or can form a layer directly over granulated, ridged, patterned, stippled, corrugated, milled, or brushed substrates (not shown). This allows the conductive polymer to get into the "nooks and crannies" of the substrate. The conductive polymer coating can have essentially the same shape and contours of the substrate, for example, forming a sleeve on the fibers. This is in contrast to conductive polymers deposited on substrates by techniques other than oCVD, where the conductive polymer can blanket the substrate (FIG. 7e) or can have irregular dimensions along the texture of the substrate and demonstrate poor morphology (FIG. 7d).

The conductive polymer can directly conform to the substrate. Pre-treatment steps or protective layers may not be required for the conductive polymer to adhere to the substrate. Pre-treatment steps can include exposing the substrate to solvents or wetting agents. The conductive polymer can have a high degree of adhesion to the substrate. The high degree of adhesion can result from in situ covalent bonding, or chemical grafting, of the polymer to a substrate possessing functional groups upon film formation. The high degree of adhesion can be advantageous for roll-to-roll processing and for flexible and stretchable electronics, where mechanical stresses could otherwise result in cracking or delamination.

The conductive polymer coating can be of a uniform thickness (i.e., said thickness does not vary more than 10% over the surface of the article; or by more than 5% over the surface of the article; or by more than 1% over the surface of the article). The thickness of the polymer coating can be between 0 and 10 nm, between 10 and 20 nm, between 20 and 30 nm, between 30 and 40 nm, between 40 and 50 nm, between 50 and 75 nm, between 75 and 100 nm or greater than 100 nm. More specifically, the thickness of the polymer coating can be 5 nm, 10 nm, 15 nm, 20 nm, 25 nm, 30 nm, 40 nm, 50 nm, 60 nm, 70 nm, 75 nm, 80 nm, 90 nm or 100 nm.

The conductive polymer coating can have a mass per surface area of less than about 500 μg/cm$^2$, less than about 100 μg/cm$^2$, less than about 50 μg/cm$^2$, less than about 10 μg/cm$^2$, or less than about 5 μg/cm$^2$. The required mass per surface area depends on the specific surface area of the substrate to be coated. A smooth flat substrate, 1 cm$^2$ in area can require coverage of only 1 cm$^2$ of area and thus the specific surface area of 1 cm$^2$/cm$^2$. However, a 1 cm$^2$ section of fabric can have a specific surface area greater than 1 because each surface-accessible fiber of the fabric must be coated. The gaseous reactants of the inventive processes can penetrate into the fabric and coat these internal surfaces. The specific surface area can depend on the packing density of the fibers and total thickness of the fabric. The thickness (cm) of the coating multiplied by the specific surface area (cm$^2$/cm$^2$) of the fabric and the density of the coating (g/cm$^3$) will yield the mass per surface area (g/cm$^2$).

The conductive polymer coating can also include a dopant, most commonly a dopant anion. A dopant can contribute to the conductivity of the polymer coating. A dopant anion can provide stability enhancement for electroactive polymers. The dopant may be any compound as long as it has a doping ability (i.e. charge stabilizing ability). For example, an organic sulfonic acid, an inorganic sulfonic acid, an organic carboxylic acid or salts thereof such as a metal salt or an ammonium salt may be used. More specifically, it can include chloride, bromide, iodide, fluoride, phosphate, sulfonate or nitrosonium hexafluorophosphate. In certain embodiments the dopant molecule comprises aqueous solutions of the acids selected from the group consisting of phosphoric acid, triflic acid, hydrochloric acid, methanesulfonic acid, oxalic acid, pyruvic acid, and acrylic acid, or a poly anion incorporating one or more of the aforementioned types of acids.

The conducting material can withstand deformation including repeated folding, stretching, bending, arching, rolling, or perforations. The conducting material can withstand severe deformation, including greater than 1000 flexing cycles (less than 5 mm radius), greater than 100 creasing cycles, or stretching greater than 150%. Withstanding the deformation can be determined by observing the presence or absence of physical damage to the conducting material, for example, cracks, tears, ruptures, snags, pills, unravels, pleats, creases, or changes in color, shape or thickness. Withstanding the deformation can be determined by measuring properties of the conducting material such as current density-voltage characteristics, work function, tensility or temperature.

A method of testing the conducting material can include making the conducting material and comparing it to a control device. The control device can have the structure ITO/PEDOT:PSS/CuPc/$C_{60}$/BCP/Ag. In particular, it can have the structure ITO (100 nm)/PEDOT:PSS (70 nm)/CuPc (20 nm)/$C_{60}$ (40 nm)/BCP (12 nm)/Ag (1000 nm). A control electrode can be the ITO/oCVD PEDOT electrode. A method of testing the conducting material can also include measuring the current density-voltage characteristics.

The conducting material can perform comparably with conventional anode structures and exhibit improved open-circuit voltage relative to bare ITO. The conducting material can provide advantageous work function and morphological benefits. The conducting material can be more conductive than a control electrode, for example, order of magnitude or more conductive than a PEDOT:PSS buffer layer. A higher fill factor can be exhibited by the conducting material when compared to the control electrode.

Light Absorbing or Light Emitting Device.

A light absorbing or a light emitting device can include a substrate and a conductive polymer coating on a surface of the substrate. The substrate with a conductive polymer coating on a surface of the substrate can be a conducting material. The conducting material can be part of a light absorbing device, for example, a photovoltaic. The conducting material can be part of a light emitting device, for example, a light emitting diode.

The substrate can have a surface area greater than area the substrate occupies. The substrate can have a surface area that is greater than 1.5 times, greater than 2 times, greater than 5 times, greater than 10 times, greater than 25 times, greater than 50 times, greater than 100 times, or greater than 500 times the area the substrate occupies.

The substrate can have a texture. For example, the texture can be fibrous, porous, granulated, patterned, ridged, stippled, corrugated, perforated, milled or brushed. The substrate can include more than one texture, or a texture can be present on only a portion of the substrate. The substrate can be flexible.

The substrate can be a fibrous substrate, for example, paper or fabric. A fibrous substrate can include fibers, threads or filaments. Paper can be a felted sheet of fibers deposited on a screen from a water suspension. Examples of paper can include rice paper, tracing paper, tissue paper, toilet paper, bathroom tissue, facial tissue, newspaper, wax paper, paper currency, banana paper, inkjet paper, wallpaper, sandpaper, cotton paper, construction paper, book paper, printer paper, parchment, fish paper, TYVEK™, wove paper, buckypaper, or paper towels. Paper can be made from a number of materials including plant fibers, for example, fibers from wood, cotton, rice, wheat, bark, bamboo, hemp, or papyrus. Paper can also be made from materials including carbon, graphene oxide, or plastic. Products of any of these materials, or combinations of any of these materials can also be used to form paper.

Fabric can be a material made by weaving, felting or knitting natural or synthetic fibers or filaments. A fabric can be made from natural sources, which can include for example, from carbon, cotton, silk, fleece, fur, leather, angora, mohair, alpaca wool, satin, goat wool, horse hair, flax, camel hair, cashmere, vicuna fleece, llama wool, milk proteins, grass, hemp, rush, straw, bamboo or wood. The fabrics made from natural sources can include linen, taffeta, tweed, wool, silk, canvas, cheesecloth, gauze, corduroy, denim, moleskin, poplin, sacking, terry cloth, lyocell, or velvet. Minerals, such as asbestos or basalt, can be used to make fabrics. Fabrics can be made from glass or metals, such as gold, silver, titanium, aluminum, copper or steel. A fabric can be synthetic, for example, satin, rayon, acrylic, acetate, nylon, aramid, latex, polyester, spandex, chiffon, polyvinyl chloride, sateen, olefin, ingeo, lurex, tulle, or viscose. A fabric can be a blend of natural materials, synthetic materials, or both.

The substrate can also be porous, meaning it can include pores or holes. A porous material can include, for example, plastic, sponge, ceramic, wood, clay, carbon or silicon.

In certain embodiments, the substrate can be a plastic, for example, polystyrene, polyamide, polyvinyl chloride, polyethylene, acrylonitrile butadiene styrene, polyester, polyurethane, polypropylene, polycarbonate, polyvinylidene chloride, polymethyl methacrylate, polytetrafluoroethylene, polyetheretherketone, polyetherimide, phenolic, urea-formaldehyde, melamine formaldehyde, polylactic acid, plastarch, polyethylene terephthalate or combination thereof. The substrate can also be an elastomer such as polydimethylsiloxane, latex or rubber. The plastic can be solid or textured.

A surface of the substrate can include a plurality of functional groups. A functional group can include a hydroxide, an alkane, an aliphatic ring, an alkene, a benzenoid ring, a thiol, an oxime, a thiocyanate, a cyanamide, a sulfonic acid, a phosphinic acid, a thiophosphate acid, an aldehyde, a ketone, an alkyne, a carboxylic acid, a carbonyl, an ester, an ether, an amide, an amine, a halide, a phenol or a nitrile. Functional groups can include an aromatic functional group such as an aromatic ester, an aromatic amide, an aromatic nitro, a phenol, a benzenoid, a benzene, an aromatic ester or an aromatic carboxylic acid. The polymer can interact, e.g. bond, with the functional groups on the substrate. A bond can be a covalent, ionic, van der Waals, dipolar or hydrogen bond.

The substrate can be transparent or semi-transparent. The substrate can allow greater than 90%, greater than 80%, greater than 70%, greater than 60%, greater than 50% or greater than 25% of light that contacts the substrate to pass through the substrate.

The light passing through the substrate can be light within the solar spectrum. The light can include electromagnetic radiation with wavelengths falling in the visible spectrum, the ultraviolet spectrum or the infrared spectrum. More specifically, the light can include electromagnetic radiation with a wavelength of 100 to 280 nm, 280 to 315 nm, 315 to 400 nm, 400 to 700 nm, 700 nm to 1 µm, 1 µm to 2 µm, or 2 µm to 3 µm. The light can include electromagnetic radiation classified as ultraviolet C, ultraviolet B, ultraviolet A, visible, infrared A, infrared B or infrared C.

The substrate can be free from pre-treatments. The substrate can also be free from solvents or wetting agents. The substrate can be hydrophobic or hydrophilic.

The substrate can be fragile, for example, it can be easily folded, shaped, torn, or cut. The substrate can also be easily damaged by common processing agents such as solvents, plasmas or heat. The substrate can be flexible, e.g., easily bent, folded or creased. A flexible substrate can be brittle or non-brittle. The substrate can be stretchable.

The conductive polymer can include monomeric units derived from optionally substituted thiophenes, optionally substituted pyrroles, optionally substituted anilines, phenanthrolines, furans, heteroarenes including more than one ring heteroatom, benzenoid arenes, non-benzenoid aromatic compounds, or combinations thereof. The polymer coating can include bicyclic thiophene, for example, a heterobicyclic thiophene such as poly(3,4-ethylenedioxythiophene). Poly (3,4-ethylenedioxythiophene can be made up of monomeric units derived from 3,4 ethylenedioxythiophene.

The conductive polymer can be a p-type semiconductor and have an excess of holes (i.e. spaces that accept electrons). The conductive polymer can be an n-type semiconductor and have an excess of free electrons.

Substrates can have textured surfaces that require fabrication processes capable of conformally coating complex geometries. The conductive polymer can be conformal to the substrate. For example, the polymer can form a layer directly around the fibers of the substrate (FIG. 7f), can form a layer directly in holes of a porous or perforated substrate (not shown), or can form a layer directly over granulated, ridged, patterned, stippled, corrugated, milled, or brushed substrates (not shown). This allows the conductive polymer to get into the "nooks and crannies" of the substrate. The conductive polymer coating can have essentially the same shape and contours of the substrate, for example, forming a sleeve on the fibers. This is in contrast to conductive polymers deposited on substrates by techniques other than oCVD, where the conductive polymer can blanket the substrate (FIG. 7e) or can have irregular dimensions along the texture of the substrate and demonstrate poor morphology (FIG. 7d).

The conductive polymer can directly conform to the substrate. Pre-treatment steps or protective layers may not required for the conductive polymer to adhere to the substrate. Pre-treatment steps can include exposing the substrate to solvents or wetting agents. The conductive polymer can have a high degree of adhesion to the substrate. The high degree of adhesion can result from in situ covalent bonding, or chemical grafting, of the polymer to a substrate possessing functional groups upon film formation. The high degree of adhesion can be advantageous for roll-to-roll processing and for flexible and stretchable electronics, where mechanical stresses could otherwise result in cracking or delamination.

The conductive polymer coating can be of a uniform thickness (i.e., said thickness does not vary more than 10% over the surface of the article; or by more than 5% over the surface of the article; or by more than 1% over the surface of the article). The thickness of the polymer coating can be between 0 and 10 nm, between 10 and 20 nm, between 20 and 30 nm, between 30 and 40 nm, between 40 and 50 nm, between 50 and 75 nm, between 75 and 100 nm or greater than 100 nm. More specifically, the thickness of the polymer coating can be 5 nm, 10 nm, 15 nm, 20 nm, 25 nm, 30 nm, 40 nm, 50 nm, 60 nm, 70 nm, 75 nm, 80 nm, 90 nm or 100 nm.

The conductive polymer coating can have a mass per surface area of less than about 500 $\mu g/cm^2$, less than about 100 $\mu g/cm^2$, less than about 50 $\mu g/cm^2$, less than about 10 $\mu g/cm^2$, or less than about 5 $\mu g/cm^2$. The required mass per surface area depends on the specific surface area of the substrate to be coated. A smooth flat substrate, 1 $cm^2$ in area can require coverage of only 1 $cm^2$ of area and thus the specific surface area of 1 $cm^2/cm^2$. However, a 1 $cm^2$ section of fabric can have a specific surface area greater than 1 because each surface-accessible fiber of the fabric must be coated. The gaseous reactants of the inventive processes can penetrate into the fabric and coat these internal surfaces. The specific surface area can depend on the packing density of the fibers and total thickness of the fabric. The thickness (cm) of the coating multiplied by the specific surface area ($cm^2/cm^2$) of the fabric and the density of the coating ($g/cm^3$) will yield the mass per surface area ($g/cm^2$).

The conductive polymer coating can also include a dopant, most commonly a dopant anion. A dopant can contribute to the conductivity of the polymer coating. A dopant anion can provide stability enhancement for electroactive polymers.

The dopant may be any compound as long as it has a doping ability (i.e. charge stabilizing ability). For example, an organic sulfonic acid, an inorganic sulfonic acid, an organic carboxylic acid or salts thereof such as a metal salt or an ammonium salt may be used. More specifically, it can include chloride, bromide, iodide, fluoride, phosphate, sulfonate or nitrosonium hexafluorophosphate. In certain embodiments the dopant molecule comprises aqueous solutions of the acids selected from the group consisting of phosphoric acid, triflic acid, hydrochloric acid, methanesulfonic acid, oxalic acid, pyruvic acid, and acrylic acid, or a poly anion incorporating one or more of the aforementioned types of acids.

The conducting material can withstand deformation, including repeated, folding, stretching, bending, arching, rolling, or perforations. The conducting material can withstand severe deformation, including greater than 1000 flexing cycles (less than 5 mm radius), greater than 100 creasing cycles, and stretching greater than 150%. Withstanding the deformation can be determined by observing the presence or absence of physical damage to the conducting material, for example, cracks, tears, ruptures, snags, pills, unravels, pleats, creases, or changes in color, shape or thickness. Withstanding the deformation can be determined by measuring properties of the conducting material such as current density-voltage characteristics, work function, tensility, or temperature.

A light absorbing or light emitting device can include an electrode and an energy converting region (FIG. 9b). The energy converting region can be between the conductive polymer and the electrode.

The electrode can include Al, Au, Ag, Ba, Yb, Ca, a lithium-aluminum alloy, a magnesium-silver alloy, indium tin oxide, gallium indium tin oxide, zinc indium tin oxide, titanium nitride or polyaniline. The electrode can be sandwiched, sputtered, or evaporated onto the energy converting region.

In some embodiments, a second electrode can be present in addition to the first electrode and the conductive polymer (FIG. 9c). In this case, the second electrode can be located on the substrate. However, in some embodiments, the conductive polymer can replace a second electrode. In these circumstances, the electrode can be a cathode and the conductive polymer can be an anode.

As previously stated, a second electrode can also be present. One possible configuration when the second electrode is present can be for the first electrode to be a cathode, the second electrode to be an anode and the conductive polymer to be part of the energy converting region. The second electrode can include indium tin oxide, gallium indium tin oxide, zinc indium tin oxide, titanium nitride or polyaniline.

The cathode can be patterned. The anode (i.e. the polymer or the second electrode) can also be patterned. The electrodes of the device can be connected to a voltage source by electrically conductive pathways.

The energy converting region can convert energy between photoenergy and electric energy. In particular, the energy converting region can convert photoenergy into electric energy. For a light absorbing device, light can strike the light absorbing device on the surface of the substrate. The substrate can be transparent or semi-transparent, allowing light to pass through to the energy converting region. As light interacts with the energy converting region, photons can be absorbed by the molecules, causing them to expel electrons and establishing a current. The energy converting region can include a light absorber, such as, for example, copper phthalocyanine, fullerene-$C_{60}$ or bathocuprine. The energy converting region can also include silicon, copper indium diselenide, zinc oxide, zinc sulfide, zinc selenide, zinc telluride, cadmium oxide, cadmium sulfide, cadmium selenide, cadmium telluride, magnesium oxide, magnesium sulfide, magnesium selenide, magnesium telluride, mercuric oxide, mercuric sulfide, mercuric selenide, mercuric telluride, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, lead telluride or combinations thereof. Specifically, the energy converting region can be a CuPc/$C_{60}$/BCP/Ag molecular organic heterojunction.

The energy converting region can include two or more layers of materials. The layers can be deposited on a surface of one of the electrodes by oxidative chemical vapor deposition, spin coating, dip coating, vapor deposition, sputtering, or other thin film deposition methods. The layers can include a p-type semiconductor and an n-type semiconductor. The layers can include a hole-injecting layer, a photoactive layer and/or an electron donating layer.

A material can be a photoactive material and include at least one dye. The photoactive material can include a plurality of dyes. Examples of dyes can include black dyes (e.g., tris (isothiocyanato)-ruthenium (II)-2,2':6',2"-terpyridine-4,4', 4"-tricarboxylic acid, tris-tetrabutylammonium salt), orange dyes (e.g., tris(2,2'-bipyridyl-4,4'-dicarboxylato) ruthenium (II) dichloride, purple dyes (e.g., cis-bis(isothiocyanato)bis-(2,2'-bipyridyl-4,4'-dicarboxylato)-ruthenium (II)), red dyes (e.g., an eosin), green dyes (e.g., a merocyanine) or blue dyes (e.g., a cyanine). Examples of additional dyes include cyanines, xanthenes, anthraquinones, merocyanines, phenoxazinones, indolines, thiophenes, coumarins, anthocyanins, porphyrins, phthalocyanines, squarates, squarylium dyes, or certain metal-containing dyes. Combinations of dyes can also be used within a given region so that a given region can include more than one (e.g., two, three, four, five, six, seven) different dyes. The dye(s) can be sorbed (e.g., chemisorbed and/or physisorbed) on the nanoparticles. A dye can be selected, for example, based on its ability to absorb photons in a wavelength range of operation (e.g., within the visible spectrum), its ability to produce free electrons (or electron holes) in a conduction band of the nanoparticles, its effectiveness in complexing with or sorbing to the nanoparticles, and/or its color.

The layers can be optimized to absorb energy from photons within the spectrum of solar light. In other words, photons from the solar spectrum have energy within the band gap of the materials comprising the layers of the energy converting region. Different layers of the energy converting region may have band gaps corresponding to different portions of the solar spectrum. The solar spectrum can include electromagnetic radiation having a wavelength within the ultraviolet A region, ultraviolet B region, ultraviolet C region, visible light region, infrared A region, infrared B region or infrared C region.

Individual light absorbing devices can be formed at multiple locations on a single substrate to form a light absorbing system. The system can include devices that absorb photons from light of different wavelengths. The system can also include different substrates or conductive polymer.

Light absorbing devices can be incorporated into a number of apparatuses including, for example, curtains, shingles, architectural elements, artistic pieces, clothes, tents, portable power supplies, shelters, shoes, wallpaper, portable electronic devices (i.e. phones, calculators, radios, mp3 players) or newspapers.

For a light emitting device, the energy converting region can convert electric energy into photoenergy. A voltage can be applied between the two electrode on either side of the energy converting region. This can supply current, which can increase the energy of the molecules in the energy converting region and the molecules quickly release the energy as photons of light. The energy converting region can include poly (p-phenylene vinylene), polyfluorene, poly(fluorenylene ethynylene), poly(phenylene ethynylene), polyfluorene vinylene, or polythiophene. The energy converting region can also include silicon, copper indium diselenide, zinc oxide, zinc sulfide, zinc selenide, zinc telluride, cadmium oxide, cadmium sulfide, cadmium selenide, cadmium telluride, magnesium oxide, magnesium sulfide, magnesium selenide, magnesium telluride, mercuric oxide, mercuric sulfide, mercuric selenide, mercuric telluride, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, lead telluride or combinations thereof.

The energy converting region can include two or more layers of materials. The layers can be deposited on a surface of one of the electrodes by oxidative chemical vapor deposition, spin coating, dip coating, vapor deposition, sputtering, or other thin film deposition methods. The layers can include a p-type semiconductor and an n-type semiconductor.

The energy converting region can include an electroluminescent or emissive material. The electroluminescent material can be selected for its emissive properties, such as emission wavelength or line width. The electroluminescent material can be a wide band gap material.

The electrical properties (such as band gaps and band offsets) of the energy converting region materials can be selected in combination with the device structure to produce a device where excitons are formed preferentially on the emissive material. The emissive material can transfer energy to an emission-altering material before light is emitted from the device. Energy transfer can occur by emission of light from the emissive material and reabsorption by the emission-altering material. Alternatively, the energy transfer can be a transfer of energy without light emission and reabsorption (such as Förster energy transfer). In either case, once the emission-altering material is in an excited state, it can emit light. In some circumstances, emission and reabsorption can be the primary method of energy transfer. When this is so, the emission-altering material need not be adjacent to the emissive material. The efficiency of Förster energy transfer, however, depends on the distance between the energy transfer partners, with smaller distances giving greater efficiency of energy transfer.

Devices can be prepared that emit visible or infrared light. Properties of semiconductor materials in the energy converting region can be selected such that the nanocrystal emits visible or infrared light of a selected wavelength. The wavelength can be between 300 and 2,500 nm or greater, for instance between 300 and 400 nm, between 400 and 700 nm, between 700 and 1100 nm, between 1100 and 2500 nm, or greater than 2500 nm.

Individual light emitting devices can be formed at multiple locations on a single substrate to form a display. The display can include devices that emit at different wavelengths. By patterning the substrate with arrays of different color-emitting semiconductor nanocrystals, a display including pixels of different colors can be formed.

The device can be made in a controlled (oxygen-free and moisture-free) environment, preventing the quenching of luminescent efficiency during the fabrication process. Other multilayer structures may be used to improve the device performance (see, for example, U.S. Pat. No. 7,332,211 and U.S. Patent Application Publication No. 2004/0023010, each of which is incorporated by reference in its entirety). A blocking layer, such as an electron blocking layer ("EBL"), a hole blocking layer ("HBL") or a hole and electron blocking layer ("eBL"), can be introduced in the structure. A blocking layer can include 3-(4-biphenylyl)-4-phenyl-5-tert-butylphenyl-1,2,4-triazole ("TAZ"), 3,4,5-triphenyl-1,2,4-triazole, 3,5-bis(4-tert-butylphenyl)-4-phenyl-1,2,4-triazole, bathocuproine ("BCP"), 4,4',4''-tris{N-(3-methylphenyl)-N-phenylamino}triphenylamine ("m-MTDATA"), polyethylene dioxythiophene ("PEDOT"), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenylamino)phenyl-1,3,4-oxadiazol-2-yl)benzene, or 1,3,5-tris[5-(4-(1,1-dimethylethyl)phenyl)-1,3,4-oxadiazol-2-yl]benzene.

The applied voltage used for light generation can be an AC voltage or DC voltage. A DC voltage can be supplied by DC voltage generator, including, for example, a battery, a capacitor, or a rectified AC voltage. An AC voltage can be supplied by an AC voltage generator which produces a voltage waveform, such as, for example, a square wave. The waveform can have a frequency of between 0.01 Hz and 100 kHz, 10 Hz and 1 MHz, 250 Hz and 100 kHz, or 500 Hz and 10 kHz. The average voltage can be between 2 and 15 volts, or 3 and 8 volts. The percentage of duty cycle used can be calculated as one hundred multiplied by the average voltage divided by the maximum voltage. The percentage of duty cycle can be the relative time in an on/off cycle (in %) during which the voltage is on. The frequency, duty cycle, and peak voltage can be adjusted to optimize light output and stability from the device. Some applications of a duty cycle are described, for example, in G. Yu et al. Applied Physics Letters 73:111-113 (1998), incorporated herein by reference in its entirety. For example, the AC voltage waveform can be a 50% duty cycle at 5 V and 1 kHz, which has a maximum voltage of 5 volts, a frequency of 1 kHz, and an average voltage of 2.5 volts. In this way, a low average operating voltage can improve the operating half-lives of the devices.

EXAMPLES

Methods

Deposition of oCVD Polymer Electrodes.

The oCVD process procedure and the reactor configuration used have been previously described. (Baxamusa, S. H., Im, S. G., Gleason, K. K., Initiated and oxidative chemical vapor deposition: a scalable method for conformal and functional polymer films on real substrates. Phys Chem Chem Phys 11, 5227 (2009); Alf, M. E. et al., Chemical Vapor Deposition of Conformal, Functional, and Responsive Polymer Films. Adv. Mater. 22, 1993 (2010); and Im, S. G., Gleason, K. K., Systematic control of the electrical conductivity of poly(3,4-ethylenedioxythiophene) via oxidative chemical vapor deposition. Macromolecules 40, 6552 (2007), each of which is incorporated by reference in its entirety.) The same reaction conditions were used for all substrates in this study. The substrate temperature was maintained elevated at ~80° C. by a PID controller to help enhance the film conductivity. (Im, S. G., (2007)). The process pressure was maintained at ~100 mTorr. The flow rate of evaporated 3,4-ethylenedioxythiophene monomer (Aldrich, 97%) was metered at ~5 sccm and $FeCl_3$ oxidant (Aldrich) was controllably evaporated from a resistively heated crucible at ~250° C. The thickness of oCVD PEDOT electrodes were determined by limiting the time of reaction (~5 min for a 50-nm thick film). oCVD PEDOT anodes were deposited for thin film and OPV characterization on pre-cleaned glass (described below) and various other substrates, which were used as received: PET (5-mil Melinex® Q65FA, Dupont), printer paper (Office Depot, 20 lb, 92 brightness, #99964200), tissue paper (Office Depot, #48601-OD), tracing paper (Canson, 25 lb, #702-321), newsprint (Pacon Papers, #3407), Reynolds® Cut-Rite® Wax Paper, and Saran™ Premium Wrap (SC Johnson).

Electrode Characterization.

Electrode thickness was measured with a Tencor P-16 profilometer and the sheet resistance was measured using a Signatone S-302-4 four-point probe station with a Keithley 4200-SCS semiconductor characterization system. The conductivity was calculated from the sheet resistance and measured thickness. The optical transmission of the polymer electrodes was measured on glass using a Varian Cary 6000i UV-Vis-NIR spectrophotometer. Flex testing for ITO/PET (Aldrich, 5-mil PET with 1000 Å ITO, 60 Ω□$^{-1}$) and oCVD PEDOT electrodes on PET was performed using an in-house flexing-test system, and the sheet resistance was measured between each flexing iteration. Stretch testing was performed using a MTS Nano Instruments Nano-UTM nanotensile tester. 5 mm×1 mm oCVD PEDOT electrodes on Saran™ wrap were anisotropically stretched by 0.01 mm increments at a strain rate of 0.005 s$^{-1}$ while the resistance across the electrode (in the direction of extension) was simultaneously measured using an Agilent U125A multimeter attached to the polymer electrode using conductive tape and alligator clips. The stretching extension was defined as the change in length of the electrode divided the initial length ($\Delta L/L_0$), and the conductivity was calculated assuming a constant film volume as described in the literature. (Hansen, T. S., West, K., Hassager, O., Larsen, N. B., Highly stretchable and conductive polymer material made from poly (3,4-ethylenedioxythiophene) and polyurethane elastomers. Adv. Funct. Mater. 17, 3069 (2007), which is incorporated by reference in its entirety). The electrode adhesion on the PET and Saran™ wrap substrates was also confirmed by tape testing (ASTM D3359-97), and the surface after flexing and stretching was imaged using an Olympus CX41 optical microscope with a maximum magnification of ×100. Electrode foldability was tested on ~100 nm oCVD PEDOT electrodes deposited on untreated newsprint; the film thickness was based on films deposited on glass slides from the same deposition. The folding tests) (±180°) were performed by creasing the paper/electrode flat using gentle pressure applied with a pencil eraser; for folding at +180°, the crease was made between two additional sheets of paper to prevent contact between the eraser and the polymer electrode. After each iteration, the paper was completely flattened back to 0° and the sheet resistance was measured across the crease with a multimeter with probe spacing of 1 cm (0.5 cm on either side of the crease).

OPV Device Fabrication.

Pre-patterned ITO/glass substrates were obtained from Thin Film Devices (sheet resistance=20Ω□). The bare glass and the ITO/glass substrates were first cleaned by sequential 5 minute ultrasonications in deionized water/detergent solution (Micro-90), deionized water, acetone, and boiling isopropyl alcohol, and then exposed to oxygen plasma for 1 minute (100 W, Plasma Preen, Inc.). For the control devices, PEDOT:PSS solution (CLEVIOS™ P VP AI 4083) was filtered (0.45 μm), spin-coated at 4000 rpm for 60 seconds, annealed at 210° C. for 5 minutes in air, and finally exposed to oxygen plasma for <5 seconds (100 W, Plasma Preen, Inc.). All substrates were then transferred to an evaporation chamber (<$10^{-6}$ Torr) where the organic active layers (CuPc, $C_{60}$, and BCP) and Ag cathodes were thermally evaporated through a shadow mask at rates of ~1 $Ås^{-1}$, measured using a calibrated quartz crystal microbalance. The overlap area between the anode and cathode defined the device area which ranged from 0.005 to 0.01 $cm^2$. The copper phthalocyanine (CuPc, Acros Organics, ca. 95% purity), fullerene-$C_{60}$ ($C_{60}$, Luminescence Technology Corp., >99.5%) and bathocuprine (BCP, Sigma Aldrich, 99.99%) were each purified once via thermal gradient sublimation, and the Ag (Alfa Aesar, 1-3 mm shot, 99.9999%) was used as received.

OPV Device Characterization.

The J-V characteristics of the OPV cells were measured in nitrogen atmosphere using a custom probe fixture with an Agilent 4156C Precision Semiconductor Parameter Analyzer and simulated AM 1.5 solar illumination from a Newport 91191 1 kW solar simulator. Opaque masks were used to selectively illuminate the active cell area, and optical density filters were used to achieve the desired intensity as measured with a calibrated Si photodiode. After testing, the exact device areas were measured with an optical microscope and used to calculate current density. Series and shunt resistances were estimated as the inverse slope of the J-V curve at V=+1.2V and 0V, respectively.

Results.

Example 1

CVD Deposition and Characterization of PEDOT Films

Figure 8:
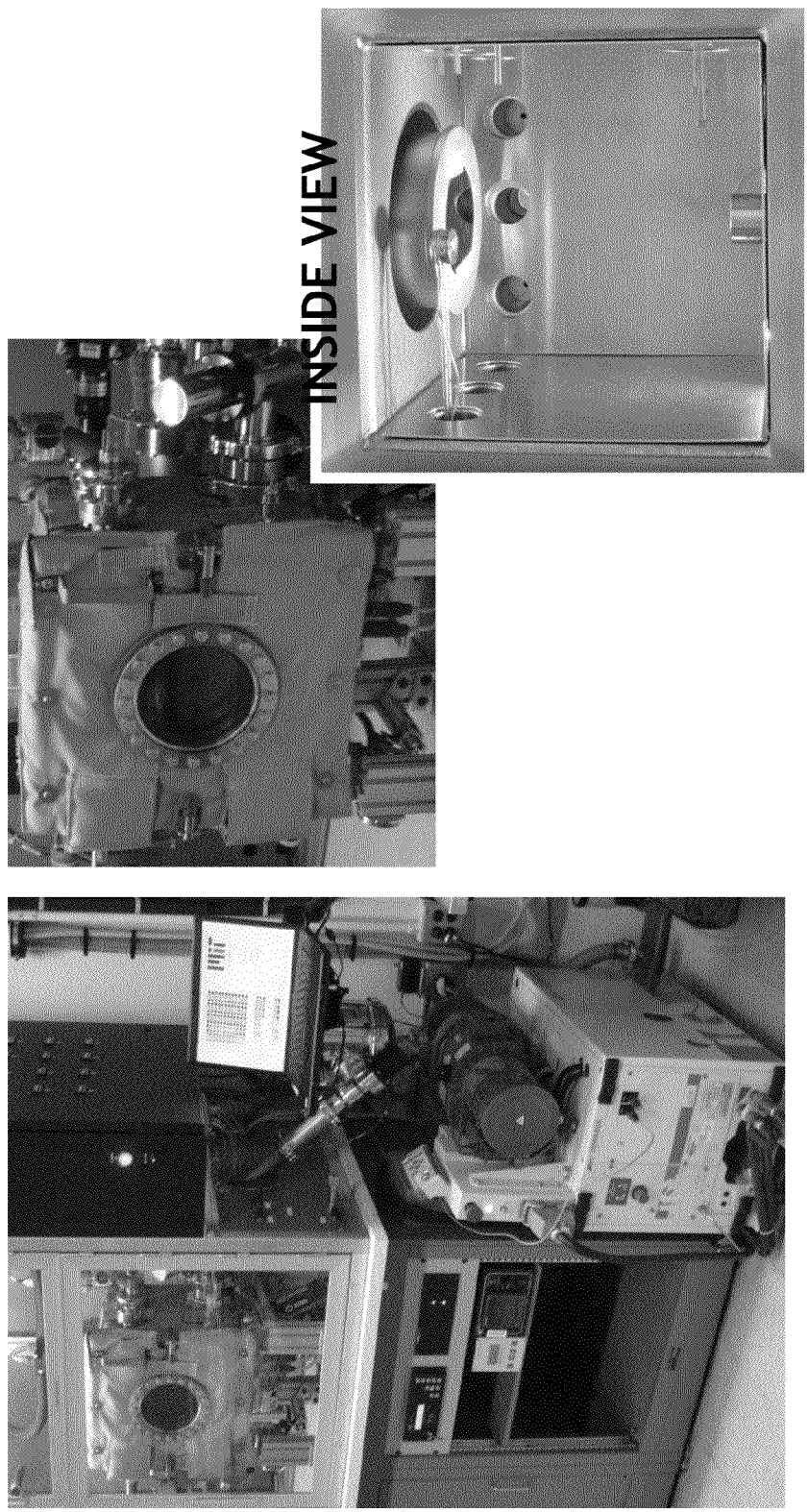
FIG. 8 shows the oCVD system.

PEDOT depositions were carried out in a custom-built vacuum chamber that has been described elsewhere and is depicted in FIG. 8. (D. D. Burkey, K. K. Gleason, J Appl Phys 93, 5143 (2003); H. G. Pryce-Lewis, D. J. Edell, K. K. Gleason, Chem Mater 12, 3488 (2000), which is incorporated by reference in its entirety). Glass slides and silicon wafers were used for substrates. The stage was regulated with cooling water and was normally kept at 34° C. A stage heater was available when stage temperatures greater than room temperature were desired. The stage was also configured to be biased with a DC Voltage using a Sorenson DCS 600-1.7 power supply. The chamber pressure was controlled by a butterfly valve connected to an MKS model 252-A exhaust valve controller and was maintained at approximately 300 mTorr. Fe(III)$Cl_3$ (97%, Aldrich) was selected as the oxidant. The powder was loaded in a porous crucible with a nominal pore size of 7 μm and positioned above the stage. The crucible was heated to a temperature of about 240° C., where sublimation of the oxidant begins to occur. Argon (Grade 5.0, BOC Gases) was delivered into the crucible as a carrier gas for the Fe(III)$Cl_3$ vapors. An argon flow rate of 2 sccm was set using an MKS mass flow controller with a range of 50 sccm $N_2$. Once a yellow film of Fe(III)$Cl_3$ was observed on the substrate, the crucible temperature was reduced to end sublimation. EDOT monomer (3,4-ethylenedioxythiophene, Aldrich) heated to 100° C. was then introduced into the reactor through heated lines and using an MKS 1153 mass flow controller set at 95° C. The EDOT flow rate was normally 10 sccm. Pyridine (99%, Aldrich) at room temperature was evaporated into the reactor using a needle valve to control the flow rate. A deposition time of 30 minutes was used for all of the films.

After deposition, the films were dried for at least 2 hours in a vacuum oven heated to 80° C. at a gauge pressure of –15 in. Hg. The thickness of the films deposited on glass was measured on a Tencor P-10 profilometer and conductivity measurements were done with a four-point probe (Model MWP-6, Jandel Engineering, Ltd). Films on silicon substrates were measured with FTIR (Nexus 870, Thermo Electron Corporation) for information on chemical composition. Deposited films were sometimes rinsed in methanol (HPLC Grade, J. T. Baker) or in a 5 mM dopant solution of nitrosonium hexafluorophosphate, $NOPF_6$, (96%, Alfa Aesar) in acetonitrile (ACS Grade, EMT). The rinse step was intended to remove any unreacted monomer or oxidant in the films as well as short oligomers and reacted oxidant remaining in the form of Fe(II) $Cl_2$. After rinsing, the films changed from a cloudy light yellow color to a sky blue hue.

Electrochemical testing took place in an aqueous 0.1M solution of sulfuric acid (VWR). The CVD PEDOT film on TTO was the working electrode, platinized copper was the counter electrode, and a saturated calomel electrode (SCE) was used as the standard. A potentiostat (EG&G Princeton Applied Research Model 263A) scanned from –0.4 V to 0.6 V based on preliminary cyclovoltammograms. In-situ UVNIS was conducted using an optical fiber to couple light from a StellarNet SLI light source with a tungsten krypton bulb emitting from 350 to 1700 nm. The spectrometer was a StellarNet EPP 2000 having a detector with a range spanning 190 to 2200 nm.

Example 2

Deposition on Fragile Substrates

Figure 5:
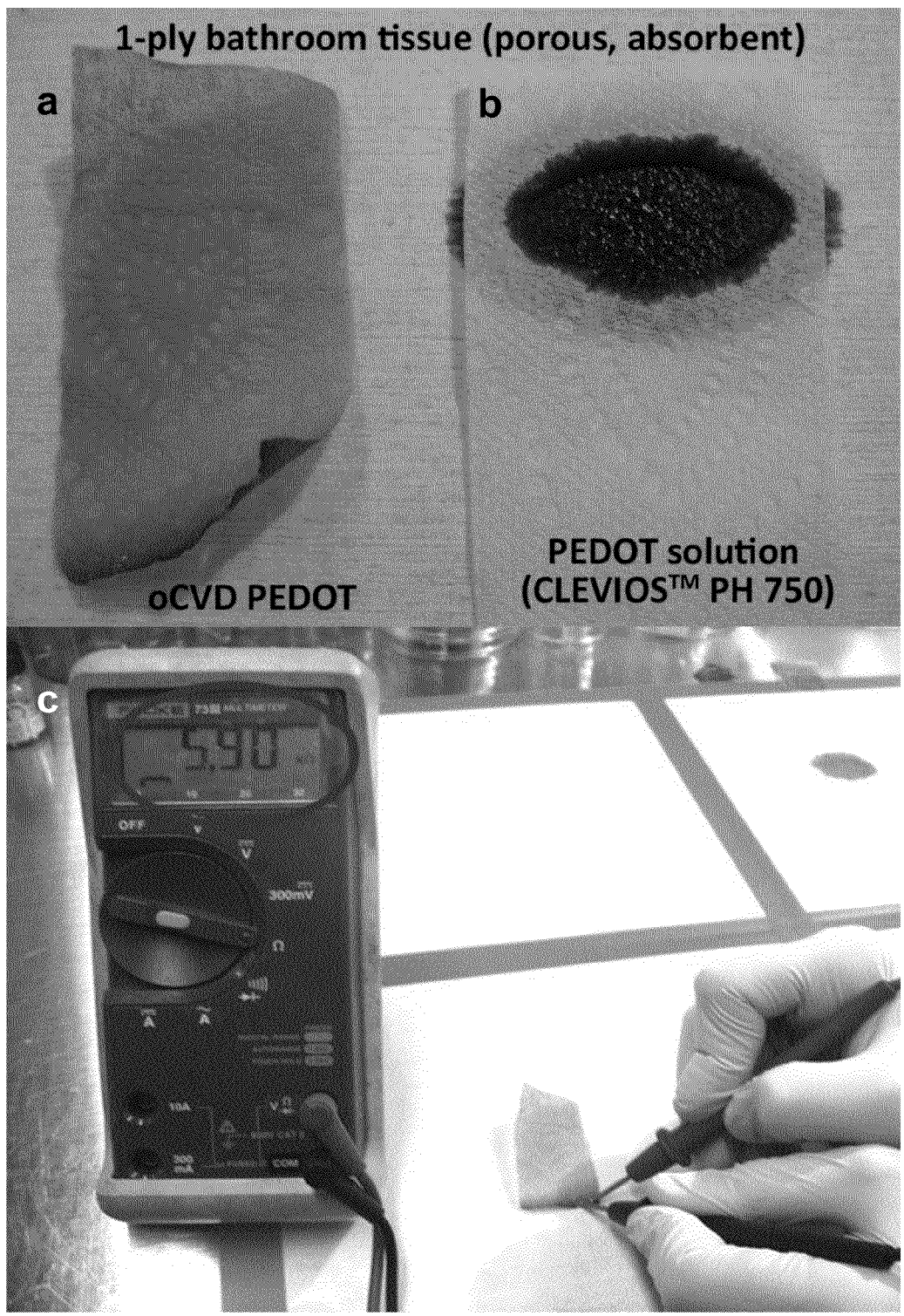
FIG. 5a shows an oCVD polymer electrode on a single ply of bathroom tissue.
FIG. 5b shows a single ply of bathroom tissue exposed to a drop-cast conducting polymer solution.
FIG. 5c shows a measurement of the 2-point film resistance of an oCVD PEDOT electrode on a single ply of bathroom tissue.
Figure 6:
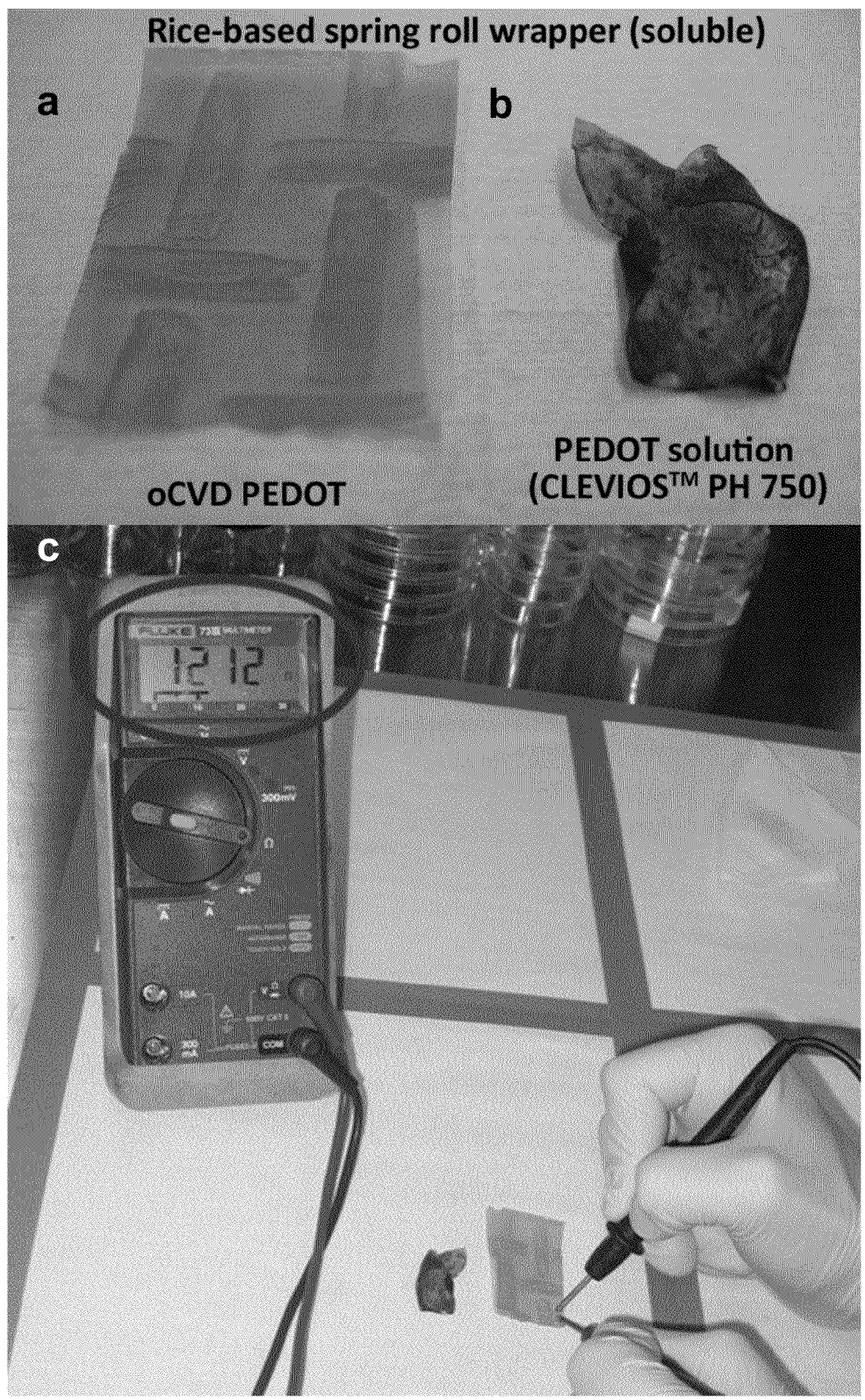
FIG. 6a shows rice paper with an oCVD polymer electrode.
FIG. 6b shows rice paper after being exposed to a drop-cast conducting polymer.
FIG. 6c shows a measurement of the 2-point film resistance of an oCVD PEDOT electrode on rice paper.

The conductive polymers have been deposited on a number of substrates with no pre- or post-treatment, even a ~10-μm thick sheet of SARAN™ wrap (FIG. 1*b*, left). In contrast, drop-cast conducting polymer formulation CLEVIOS™ PH 750 (>650 S $cm^{-1}$ as a dried film) did not wet this hydrophobic surface (FIG. 1*b*, right). While oxygen plasma pretreatment has been reported to enhance wettability, this additional step can also add cost and can easily degrade the mechanical, chemical, and morphological properties of fragile substrates. The conductive polymers also formed on substrates that would be destroyed or dissolved by solvents, such as absorbent and water-soluble papers, (e.g. bathroom tissue and rice paper, respectively; FIGS. 5 and 6).

Example 3 oCVD PEDOT Electrodes oCVD PEDOT (poly(3,4-ethylenedioxythiophene)) electrodes can successfully replace the conventional indium tin oxide (ITO) anodes in organic photovoltaic devices (FIG. 2*a*, inset) fabricated with the well-studied CuPc/$C_{60}$/BCP/Ag molecular organic heterojunction architecture. (Peumans, P., Forrest, S. R., Very-high-efficiency double-heterostructure copper phthalocyanine/C-60 photovoltaic cells. Appl. Phys. Lett. 79, 126 (2001); Schultes, S. M., Sullivan, P., Heutz, S., Sanderson, B. M., Jones, T. S., The role of molecular architecture and layer composition on the properties and performance of CuPc-C-60 photovoltaic devices. Mater. Sci. Eng., C 25, 858 (2005); and Brumbach, M., Placencia, D., Armstrong, N. R., Titanyl phthalocyanine/C-60 heterojunctions: Band-edge offsets and photovoltaic device performance. J. Phys. Chem. C 112, 3142 (2008), each of which is incorporated by reference in it entirety). Importantly, all of the other device layers can also deposited at low temperature and without the use of solvents, via vacuum thermal evaporation, allowing us to employ a versatile array of substrates. To eliminate the possibility of performance variation due to fabrication conditions, all oCVD-based devices were fabricated and tested in parallel with control devices, with structure ITO (100 nm)/PEDOT:PSS (70 nm)/CuPc (20 nm)/$C_{60}$ (40 nm)/BCP (12 nm)/Ag (1000 nm).

Figure 2:
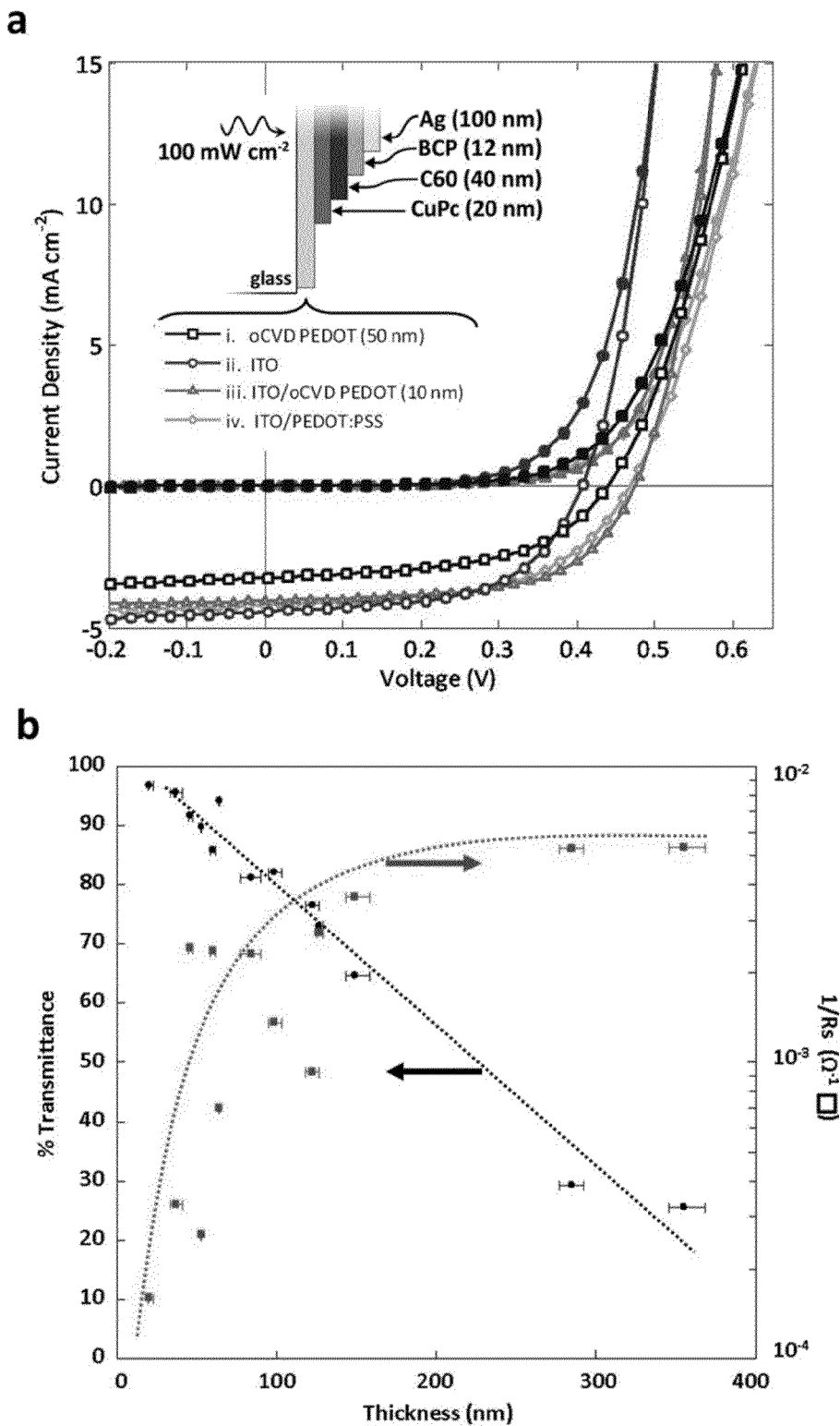
FIG. 2a is a graph demonstrating the current-voltage ("J-V") characteristics for oCVD PEDOT-based organic photovoltaics ("OPVs") and conventional indium tin oxide ("ITO") based OPVs on rigid glass substrates.
FIG. 2b is a graph showing the effect of oCVD film thickness on transmittance and inverse sheet resistance.

FIG. 2a compares representative current density-voltage (J-V) characteristics for OPVs on glass differing only in anode structure: (i) oCVD PEDOT, (ii) ITO, (iii) ITO/oCVD PEDOT, (iv) ITO/PEDOT:PSS. The devices incorporating oCVD anodes (i and iii) performed comparably with the conventional anode structures (ii and iv), and both exhibited improved open-circuit voltage relative to bare ITO. This suggested that the oCVD layers can provide an advantageous work function and/or morphological benefit, analogous to behavior observed for PEDOT:PSS buffer layers. (Peumans, P., Forrest, S. R., Very-high-efficiency double-heterostructure copper phthalocyanine/C-60 photovoltaic cells. Appl. Phys. Lett. 79, 126 (2001); Armstrong, N. R. et al., Interface modification of ITO thin films: organic photovoltaic cells. Thin Solid Films 445, 342 (2003); and Snaith, H. J., Kenrick, H., Chiesa, M., Friend, R. H., Morphological and electronic consequences of modifications to the polymer anode 'PEDOT:PSS'. Polymer 46, 2573 (2005), each of which is incorporated by reference in its entirety.) While both oCVD PEDOT and PEDOT:PSS have comparable work functions (~5.2 eV) 15, the oCVD electrode was orders of magnitude more conductive than the PEDOT:PSS buffer layer (<10 S $cm^{-1}$). Indeed, the ITO/oCVD PEDOT electrodes (iii) exhibited the highest fill factor (>0.6) of the devices tested. This can be consistent with a reduction in device series resistance relative to ITO/PEDOT:PSS (iv) (Table 1). For the ITO-free oCVD electrodes (i), there was a trade-off between sheet resistance and transparency with thickness (FIG. 2b), which may account for the small differences in fill factor and short circuit current relative to (ii) (Table 1).

TABLE 1

Solar cell parameters for OPVs with different anode layers.

| Anode Material | $J_{sc}$ (mA $cm^{-2}$) | $V_{oc}$ (V) | Fill Factor | $R_{series}$ (Ω · $cm^2$) | $R_{shunt}$ (Ω · $cm^2$) |
|---|---|---|---|---|---|
| oCVD PEDOT | 3.2 | 0.44 | 0.54 | 5.0 | $0.8 \times 10^3$ |
| ITO | 4.4 | 0.41 | 0.57 | 0.6 | $1.0 \times 10^3$ |
| ITO/oCVD PEDOT | 4.1 | 0.48 | 0.60 | 1.2 | $1.2 \times 10^3$ |
| ITO/PEDOT:PSS | 4.2 | 0.47 | 0.56 | 7.2 | $1.1 \times 10^3$ |

Figure 3:
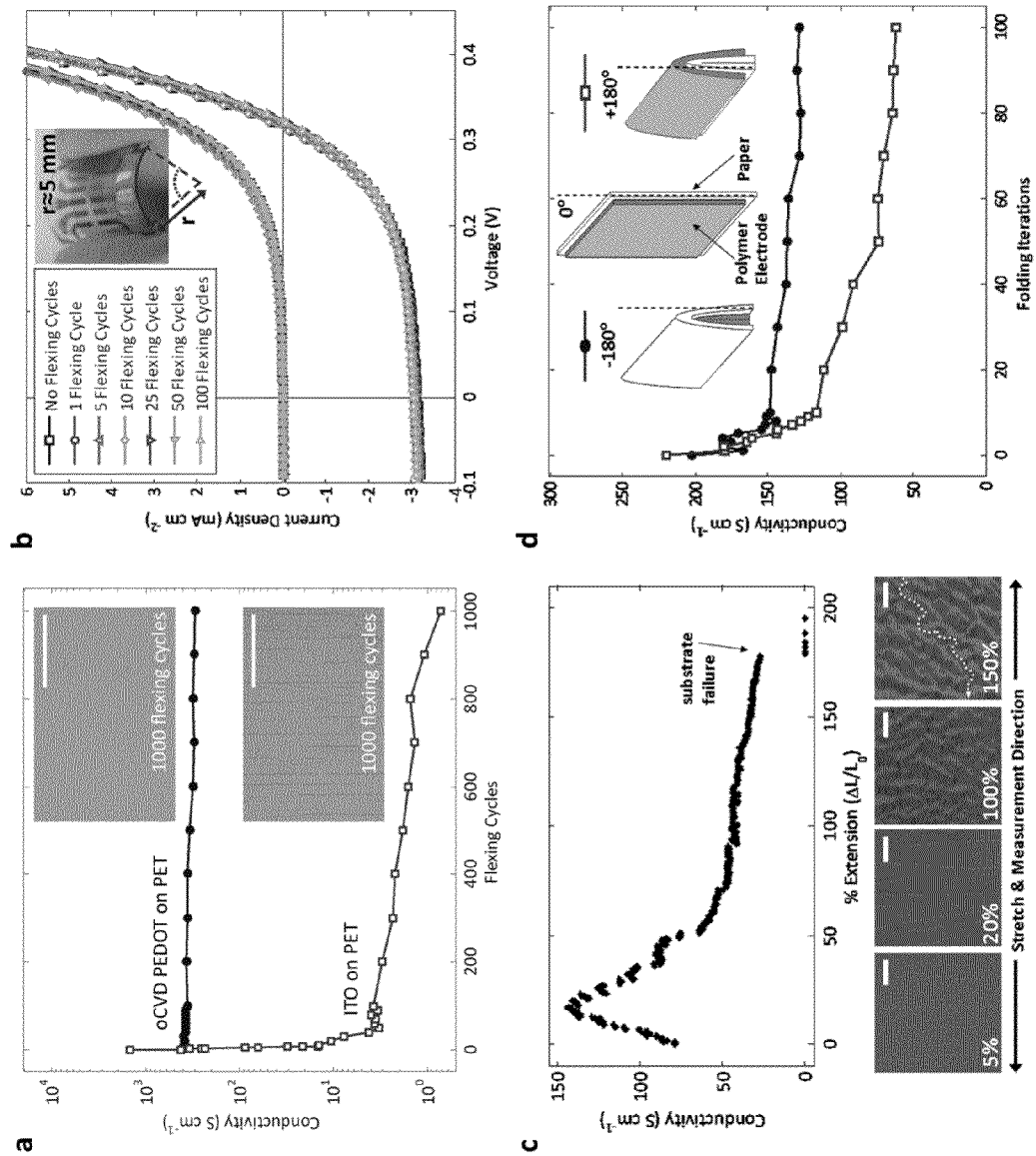
FIG. 3a is a graph demonstrating the conductivity with respect to flexing cycle for oCVD PEDOT film covalently bonded to a flexible polyethylene terephthalate ("PET") substrate and ITO-coated PET.
FIG. 3b is a graph showing the J-V characteristics of an ITO-free OPV on PET before and after flexing cycles.
FIG. 3c is a graph demonstrating the conductivity of an oCVD PEDOT electrode on SARAN™ wrap as it is anisotropically stretched until substrate failure.
FIG. 3d is a graph demonstrating the conductivity of an oCVD PEDOT electrode on newsprint after repeated folding.

Uniquely, oCVD conducting polymers can be in situ covalently bonded (grafted) to flexible substrates possessing aromatic functional groups upon film formation (e.g. on common polystyrenes (PS) and polyethylene terephthalates (PET)). The superior adhesion of the grafted films can be desirable for roll-to-roll processing and for flexible and stretchable electronics, where mechanical stresses could otherwise result in catastrophic cracks or delamination. Indeed, after 1000 flexing cycles at <5 mm radius (FIG. 3a), the electrical conductivity of oCVD PEDOT on a PET substrate was minimally affected while that of commercial ITO-coated PET decreased over 400-fold due to severe crack formation (FIG. 3a, inset), a direct result of the brittle nature of the ITO and relatively weak substrate adhesion. (Cairns, D. R. et al., Strain-dependent electrical resistance of tin-doped indium oxide on polymer substrates. Appl. Phys. Lett. 76, 1425 (2000), which is incorporated by reference in its entirety). In contrast, the oCVD PEDOT exhibited no cracking and maintained its electrical conductivity even through extreme flexes at a radius <1 mm. Moreover, after over 100 flexing cycles, OPVs with oCVD PEDOT electrodes (i) on PET, displayed no noticeable change in performance (FIG. 3b). Thus, the flexibility of the oCVD electrode may have allowed the subsequent device layer to retain its integrity upon flexing. This was strong contrast to reports for "flexible" ITO-based OPVs in which electrode cracking propagated through the device, ultimately resulting in shorting. (Na, S. I., Kim, S. S., Jo, J., Kim, D. Y., Efficient and Flexible ITO-Free Organic Solar Cells Using Highly Conductive Polymer Anodes. Adv. Mater. 20, 4061 (2008), which is incorporated by reference in its entirety).

The stretchability of oCVD PEDOT electrodes was exhibited on common Saran™ wrap (~10-μm thick) (FIG. 3c). The oCVD PEDOT was also covalently bonded to this PET-based substrate, inhibiting slippage and ensuring that the polymer electrode was stretched along with the substrate. Under moderate stretching (up to 25% extension) the conductivity steadily increases, most likely due to molecular chain alignment, as has been reported for other conducting polymer films. (Ogasawara, M., Funahashi, K., Demura, T., Hagiwara, T., Iwata, K., Enhancement of Electrical-Conductivity of Polypyrrole by Stretching. Synth. Met. 14, 61 (1986); and Hansen, T. S., West, K., Hassager, O., Larsen, N. B., Highly stretchable and conductive polymer material made from poly (3,4-ethylenedioxythiophene) and polyurethane elastomers. Adv. Funct. Mater. 17, 3069 (2007), each of which is incorporated by reference in its entirety). The conductivity then slowly declined; however, significant electrical conductance was maintained until there was mechanical failure of the underlying substrate at nearly 200%. This exceeded the stretchability of typical metals, ITO, graphene, and even "wavy" silicon ribbons (electrical failure at ~5-30% extension) and was comparable to some of the best reports for conducting polymer films and composites (electrical failure at ~100-200% extension). (Cairns, D. R. et al., Strain-dependent electrical resistance of tin-doped indium oxide on polymer substrates. Appl. Phys. Lett. 76, 1425 (2000); Hansen, T. S., West, K., Hassager, O., Larsen, N. B., Highly stretchable and conductive polymer material made from poly(3,4-ethylenedioxythiophene) and polyurethane elastomers. Adv. Funct. Mater. 17, 3069 (2007); Li, T., Huang, Z. Y., Suo, Z., Lacour, S. P., Wagner, S., Stretchability of thin metal films on elastomer substrates. Appl. Phys. Lett. 85, 3435 (2004); Kim, K. S. et al., Large-scale pattern growth of graphene films for stretchable transparent electrodes. Nature 457, 706 (2009); Rogers, J. A., Someya, T., Huang, Y. G., Materials and Mechanics for Stretchable Electronics. Science 327, 1603; Sekitani, T. et al., A rubberlike stretchable active matrix using elastic conductors. Science 321, 1468 (2008); Urdaneta, M. G., Delille, R., Smela, E., Stretchable electrodes with high conductivity and photo-patternability. Adv. Mater. 19, 2629 (2007), each of which is incorporated by reference in its entirety). Microscopic cracks gradually formed and became larger as the film was stretched, which interrupted the current conduction along the stretch direction; there were, however, complete conducting polymer pathways visible even at 150% extension (FIG. 3c, lower).

The foldability of oCVD PEDOT electrodes on paper substrates was demonstrated by repeatedly creasing the electrodes (FIG. 3d). After an initial decrease over the first ~10 creases, the conductivity levels fell off at 50-150 S $cm^{-1}$, and significant conductance was retained after over 100 folding iterations. This was in contrast to evaporated metal films, which exhibited complete electrical failure after fewer than 10 folding iterations. (Siegel, A. C. et al., Foldable Printed Circuit Boards on Paper Substrates. Adv. Funct. Mater. 20, 28 (2010), which is incorporated by reference in its entirety). Moreover, conductivities on paper that are comparable to planar films grown on glass substrates during the same deposition cycle were observed. This was remarkable, considering the oCVD film thickness was much less than the RMS surface roughness of the paper (~2-4 μm). The high conductivity of oCVD PEDOT on such a highly non-planar surface and its endurance to repeated folding iterations may be rooted in the ability of the vapor-phase oCVD process to penetrate into the fibers of the paper substrate and create a partially conformal coating throughout the fiber matrix. This may impart good mechanical and electrical connectivity.

OPVs were also fabricated directly on various as-purchased paper substrates. The transparent polymer electrodes were conformally deposited on the delicate paper fibers without any pretreatment steps or protecting layers. The versatility of this ability can be hard to match by any other thin-film deposition technique. To help prevent electrical shorting through the nonconformally evaporated active layers, the thickness of the CuPc layer was increased from 20 nm to 100 nm. (Yang, F., Shtein, M., Forrest, S. R., Controlled growth of a molecular bulk heterojunction photovoltaic cell. Nature Mater. 4, 37 (2005), which is incorporated by reference in its entirety.) The low transparency of the paper substrates along with the high CuPc absorption may have inhibited the intensity of light illuminating the OPV within an exciton diffusion length of the photoactive heterojunction. Thus, for these devices the paper-substrates were illuminated with high-intensity 500 mW cm$^{-2}$ simulated solar illumination to illuminate the photoactive interface as close as possible to intensities typical of OPVs on glass/ITO under 100 mW cm$^{-2}$ illumination. Characteristic J-V performance curves (FIG. 4a) showed significant power generation for completed OPVs on tracing paper (b), tissue paper (c), and printer paper (d). The relatively low open-circuit voltage as compared to the standard glass-based devices was likely a result of increased current pathways through the nonconformal photoactive layers that allow facile charge transport opposite the photogenerated current. The short circuit currents scaled with substrate transparency, which was expected; however, they were relatively high considering the absorptive substrate and thick CuPc layer, suggesting there may be enhanced light utilization due to favorable scattering through the roughened substrate and interfaces.

Figure 4:
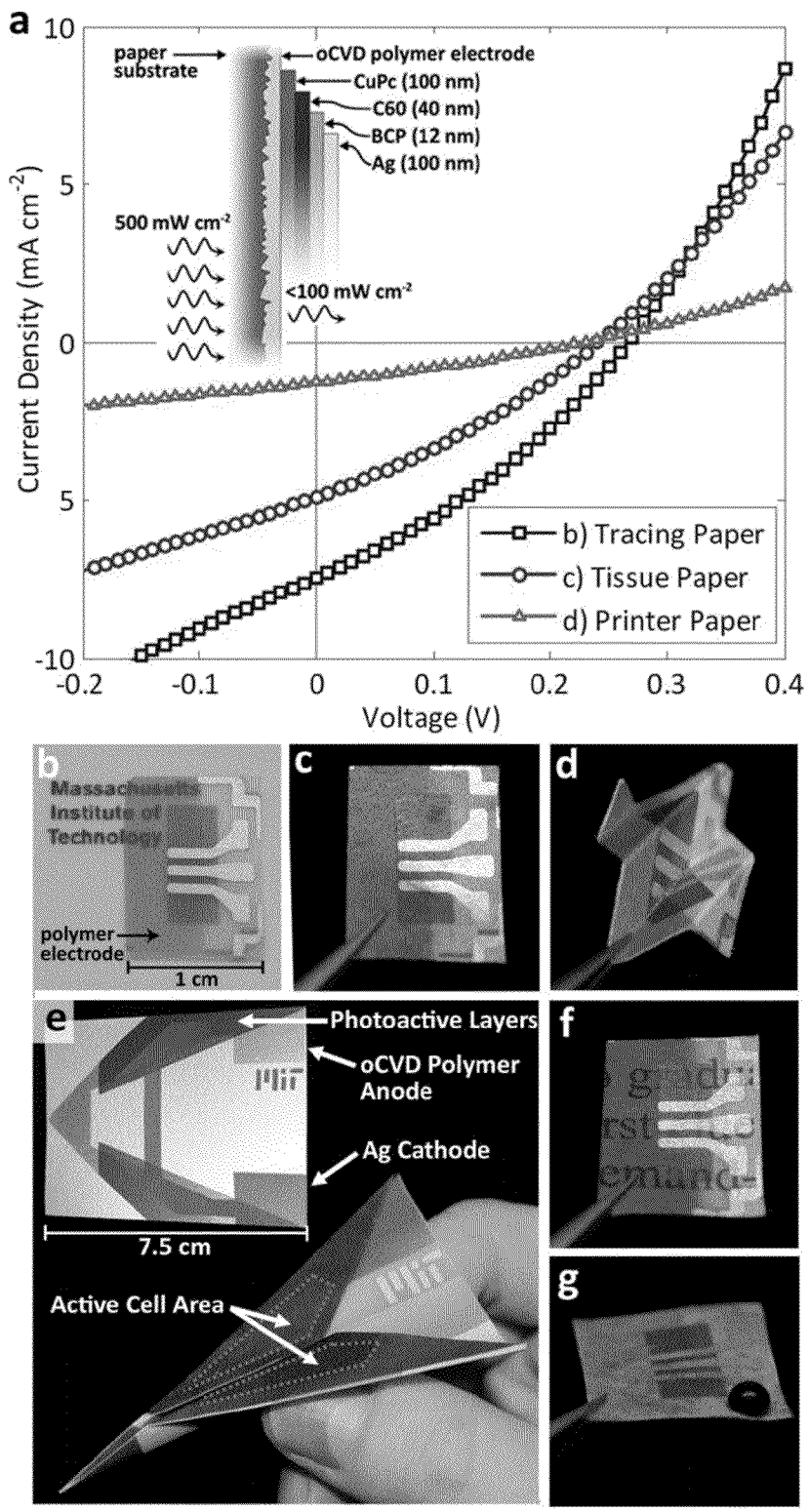
FIG. 4a is a graph showing the J-V performance characteristics of OPVs utilizing oCVD PEDOT electrodes on tracing paper (FIG. 4b), tissue paper (FIG. 4c), and printed paper (FIG. 4d).
FIG. 4e shows a paper airplane with integrated photovoltaic wings folded from a sheet of tracing paper patterned with an oCVD-enabled device.
FIG. 4f shows printed newspaper with an oCVD-enabled device.
FIG. 4g shows wax paper with an oCVD-enabled device.

The foldability of these devices as well as their ultra-light weight was evident. Ultrathin paper substrates (e.g., tissue paper) weigh ~10$^{-3}$ g cm$^{-2}$, in comparison to ~10$^{-1}$ g cm$^{-2}$ for a crystalline Si wafer and ~10$^{-2}$ g cm$^{-2}$ for a conventional 5 mil PET plastic substrate. Although the efficiency of the ultrathin paper-based devices was lower than state-of-the-art solar modules, they exhibited high power-to-weight ratios of up to 550 W kg$^{-1}$ under these testing conditions, and continued improvements in the cell efficiency may further extend their light-weight advantage. The devices were also easily patterned over large areas and maintained photovoltaic power generation after folding into three-dimensional structures. FIG. 4g shows a thin-film photovoltaic cell integrated into the wings of a paper airplane on a ~50 cm$^2$ sheet of tracing paper that was first patterned with the oCVD-enabled device structure. The oCVD fabrication process was also compatible with other common papers, such as newsprint, without disturbing the underlying printed ink (FIG. 4e), and even wax paper (FIG. 4f), which was resistant to or damaged by common solvents.

The nondestructive oCVD method enabled rapid fabrication of highly conductive, flexible, adherent, and transparent polymer electrodes from earth-abundant elements on virtually any substrate, including delicate papers and plastics for large-area applications. Integration into OPV structures resulted in ITO-free devices having comparable performance to control devices that utilize industry standard materials and processes. The versatility of the oCVD conducting polymers was illustrated by organic solar cells on a variety of as-purchased "everyday" paper substrates, including printer paper, tissue paper, and tracing paper, fabricated without any pretreatment steps or protecting layers, and exhibiting power-to-weight ratios over 500 W kg$^{-1}$. The oCVD conducting polymer electrodes maintained their high conductance even when flexed (>1000 times), creased (>100 times), and stretched (~200%), far exceeding the durability of ITO and other standard electrode materials. Beyond the applications in OPV structures, oCVD polymers can be similarly integrated in other large and small-area optoelectronic device structures. Moreover, as the existing library of electrically and optically active oCVD polymer chemistries grows, the power of this technique may increase accordingly and it may be readily possible to make complete devices conformally on complex and delicate substrates for novel architectures and ultimately improved performance.

What is claimed is:

1. A light absorbing or emitting device comprising:
a substrate with a porous or fibrous surface;
an electrode consisting of a conductive polymer coating directly on the porous or fibrous surface of the substrate, wherein the polymer coating is conformal to the porous or fibrous surface of the substrate and the thickness of the conductive polymer coating does not vary more than 10%;
a counter electrode; and
an energy converting region between the electrode and counter electrode capable of converting energy between photoenergy and electric energy.

2. The light absorbing or emitting device of claim 1, wherein the substrate is flexible.

3. The light absorbing or emitting device of claim 1, wherein the substrate is paper or cloth.

4. The light absorbing or emitting device of claim 1, wherein the polymer coating includes monomeric units derived from optionally substituted thiophenes, optionally substituted pyrroles or optionally substituted anilines.

5. The light absorbing or emitting device of claim 4, wherein the polymer coating includes poly(3,4-ethylenedioxythiophene).

6. The light absorbing or emitting device of claim 1, wherein the polymer coating includes at least one dopant.

7. The light absorbing or emitting device of claim 1, wherein the polymer coating is an anode and the electrode is a cathode.

8. The light absorbing or emitting device of claim 1, wherein the energy converting region includes copper phthalocyanine, fullerene-$C_{60}$ or bathocuprine.

9. The light absorbing or emitting device of claim 1, wherein the energy converting region includes poly(p-phenylene vinylene), polyfluorene, poly(fluorenylene ethynylene), poly(phenylene ethynylene), polyfluorene vinylene, or polythiophene.

10. The light absorbing or emitting device of claim 1, wherein the energy converting region includes at least one material selected from the group consisting of: silicon, copper indium diselenide, zinc oxide, zinc sulfide, zinc selenide, zinc telluride, cadmium oxide, cadmium sulfide, cadmium selenide, cadmium telluride, magnesium oxide, magnesium sulfide, magnesium selenide, magnesium telluride, mercuric oxide, mercuric sulfide, mercuric selenide, mercuric telluride, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, or lead telluride.

11. The light absorbing or light emitting device of claim 1, wherein the device is a photovoltaic.

12. The light absorbing or emitting device of claim 1, wherein the textured surface coated with the conductive polymer is porous or fibrous.

13. The light absorbing or emitting device of claim 1, wherein the polymer coating is conformal to the fibrous or porous surface.

14. A light absorbing or emitting photovoltaic device comprising:
- a substrate with a porous or fibrous surface;
- an anode, wherein the anode is consisting of a conductive polymer coating on the porous or fibrous surface of the substrate, and wherein the conductive polymer coating is conformal to the porous or fibrous surface of the substrate and the conductive polymer coating has a thickness that does not vary more than 10%;
- a cathode; and
- an energy converting layer capable of converting energy between photoenergy and electric energy, wherein the energy converting layer has a first surface and a second surface, and wherein the first surface is in contact with the anode, and the second surface is contact with the cathode.

15. The device of claim 1, wherein the conductive polymer coating has a conductivity of approximately 100 S/cm.

16. The device of claim 1, wherein the conductive polymer coating has a conductivity of at least 100 S/cm.

17. The device of claim 1, wherein the conductive polymer coating has a conductivity of at least 200 S/cm.

18. The device of claim 1, wherein the conductive polymer coating has a conductivity of at least 400 S/cm.

19. The device of claim 1, wherein the conductive polymer coating has a conductivity of at least 500 S/cm.

20. The device of claim 1, wherein the conductive polymer coating has a conductivity of at least 500 and less than 1000 S/cm.

* * * * *